US012543482B2

(12) United States Patent
Sakuma et al.

(10) Patent No.: US 12,543,482 B2
(45) Date of Patent: Feb. 3, 2026

(54) DISPLAY DEVICE

(71) Applicant: SHARP KABUSHIKI KAISHA, Sakai (JP)

(72) Inventors: Jun Sakuma, Sakai (JP); Yasushi Asaoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 497 days.

(21) Appl. No.: 17/778,989

(22) PCT Filed: Dec. 2, 2019

(86) PCT No.: PCT/JP2019/047042
§ 371 (c)(1),
(2) Date: May 23, 2022

(87) PCT Pub. No.: WO2021/111501
PCT Pub. Date: Jun. 10, 2021

(65) Prior Publication Data
US 2022/0416213 A1    Dec. 29, 2022

(51) Int. Cl.
*H10K 59/80* (2023.01)
*H10K 50/115* (2023.01)
(Continued)

(52) U.S. Cl.
CPC ........... *H10K 59/878* (2023.02); *H10K 59/35* (2023.02); *H10K 59/879* (2023.02);
(Continued)

(58) Field of Classification Search
CPC ...... H10K 50/858; H10K 59/35; H10K 71/00; H10K 50/115; H10K 59/122;
(Continued)

(56) References Cited

U.S. PATENT DOCUMENTS

2011/0148944 A1* 6/2011 Kobayashi .......... H10K 59/128
345/690
2012/0319141 A1* 12/2012 Kim .................... H10K 59/122
257/40
(Continued)

FOREIGN PATENT DOCUMENTS

JP          2011-129392 A        6/2011
JP          2015191708 A  * 11/2015  .......... H10K 59/878
(Continued)

OTHER PUBLICATIONS

JP_2015191708_A_I (Year: 2015).*
(Continued)

*Primary Examiner* — Yara B Green
*Assistant Examiner* — Akhee Sarker-Nag
(74) *Attorney, Agent, or Firm* — ScienBiziP, P.C.

(57)    ABSTRACT

A display device, includes: a first light-emitting element emitting a first light having a first wavelength; and a second light-emitting element emitting a second light having a second wavelength, the first light and the second light being released in a first direction; a first optical layer formed in a second direction with respect to the first light-emitting element, and positioned to coincide with the first light-emitting element in the second direction, the first optical layer being transparent to the light having the second wavelength and reflective or absorptive of the light having the first wavelength; and a second optical layer formed in the second direction with respect to the second light-emitting element, and positioned to coincide with the second light-emitting element in the second direction, the second optical layer being transparent to the light having the first wavelength and reflective or absorptive of the light having the second wavelength.

20 Claims, 21 Drawing Sheets

(51) Int. Cl.
*H10K 59/121* (2023.01)
*H10K 59/122* (2023.01)
*H10K 59/35* (2023.01)

(52) U.S. Cl.
CPC .......... *H10K 50/115* (2023.02); *H10K 59/121* (2023.02); *H10K 59/122* (2023.02)

(58) Field of Classification Search
CPC ............... H10K 59/879; H10K 59/878; H10K 2102/3031; H10K 59/121; G02B 5/28; G09F 9/30; H05B 33/12; H05B 33/14; H05B 33/22
See application file for complete search history.

(56) References Cited

U.S. PATENT DOCUMENTS

| | | | |
|---|---|---|---|
| 2013/0299808 A1* | 11/2013 | Sugimoto | H10K 59/878 257/89 |
| 2014/0252336 A1 | 9/2014 | Kobayashi | |
| 2015/0037916 A1* | 2/2015 | Rohatgi | H10K 59/873 438/28 |
| 2015/0380468 A1* | 12/2015 | Fan | H10K 59/84 257/40 |
| 2018/0151539 A1* | 5/2018 | Nakamura | H10K 59/18 |

FOREIGN PATENT DOCUMENTS

| | | |
|---|---|---|
| JP | 2016-181361 A | 10/2016 |
| JP | 2017188399 A * | 10/2017 |
| JP | 2018063399 A * | 4/2018 |

OTHER PUBLICATIONS

JP_2017188399_A_I (Year: 2017).*
JP_2015191708_A_I_English (Year: 2015).*
JP_2017188399_A_I_English (Year: 2017).*
JP_2018063399_A_I_English (Year: 2018).*

* cited by examiner

DISPLAY DEVICE

TECHNICAL FIELD

The disclosure relates to a display device including a light-emitting element.

SUMMARY

Background Art

Patent Document 1 discloses a light-transparent display device including a plurality of light-emitting elements.

CITATION LIST

Patent Literature

[Patent Document 1] Japanese Unexamined Patent Publication Application No. 2016-181361

SUMMARY OF INVENTION

Technical Problems

In a transparent display device such as the one disclosed in Patent Document 1, clearances are provided between neighboring light-emitting elements to make the display device sufficiently transparent. However, the clearances reduce the proportion of a light-emitting region with respect to the whole display region of the above display device. Hence, it is difficult for the display device described in Patent Document 1 to simultaneously achieve high luminance and high light-transparency.

Solution to Problems

In order to solve the above problems, a display device according to an aspect of the disclosure includes: a first light-emitting element configured to emit a first light including a light having a first wavelength; and a second light-emitting element configured to emit a second light including a light having a second wavelength different from the first wavelength, each of the first light and the second light being released in a first direction; a first optical layer formed in a second direction, opposite the first direction, with respect to the first light-emitting element, and positioned to coincide with the first light-emitting element in the second direction, the first optical layer being transparent to the light having the second wavelength and reflective or absorptive of the light having the first wavelength; and a second optical layer formed in the second direction with respect to the second light-emitting element, and positioned to coincide with the second light-emitting element in the second direction, the second optical layer being transparent to the light having the first wavelength and reflective or absorptive of the light having the second wavelength.

Advantageous Effect of Disclosure

An aspect of the disclosure can provide a transparent display device that simultaneously achieves high luminance and high light-transparency more efficiently.

FIG. 1 is a schematic cross-sectional view of a display device according to a first embodiment of the disclosure FIG. 2 is a schematic plan view of the display device according to the first embodiment of the disclosure FIG. 3 is an enlarged cross-sectional view of, and around, a first light-emitting element of the display device according to the first embodiment of the disclosure FIG. 4 is a graph showing, for each of the wavelengths, intensity of a first light from the first light-emitting element, intensity of an outside light, and absorptivity of a first optical layer as to the display device according to the first embodiment of the disclosure.

FIG. 5 is a graph showing, for each of the wavelengths, transmissive intensity of the first light from the first light-emitting element in a first direction, and transmissive intensity of the outside light as to the display device according to the first embodiment of the disclosure FIG. 6 is a graph showing, for each of the wavelengths, transmissive intensity of the first light from the first light-emitting element in a second direction, and transmissive intensity of the outside light as to the display device according to the first embodiment of the disclosure.

DESCRIPTION OF EMBODIMENTS

First Embodiment

Figure 1:
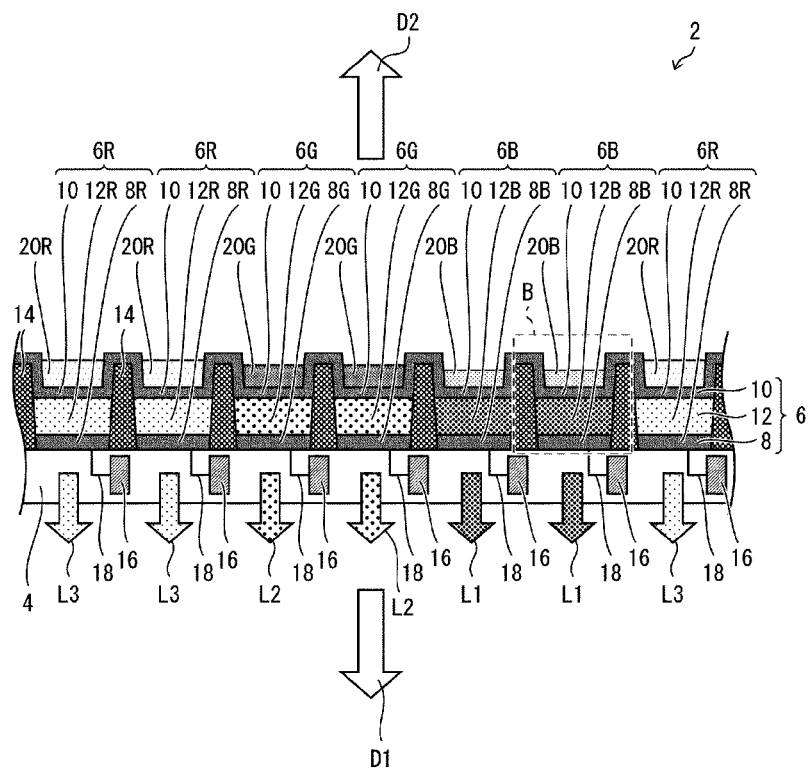
Figure 2:
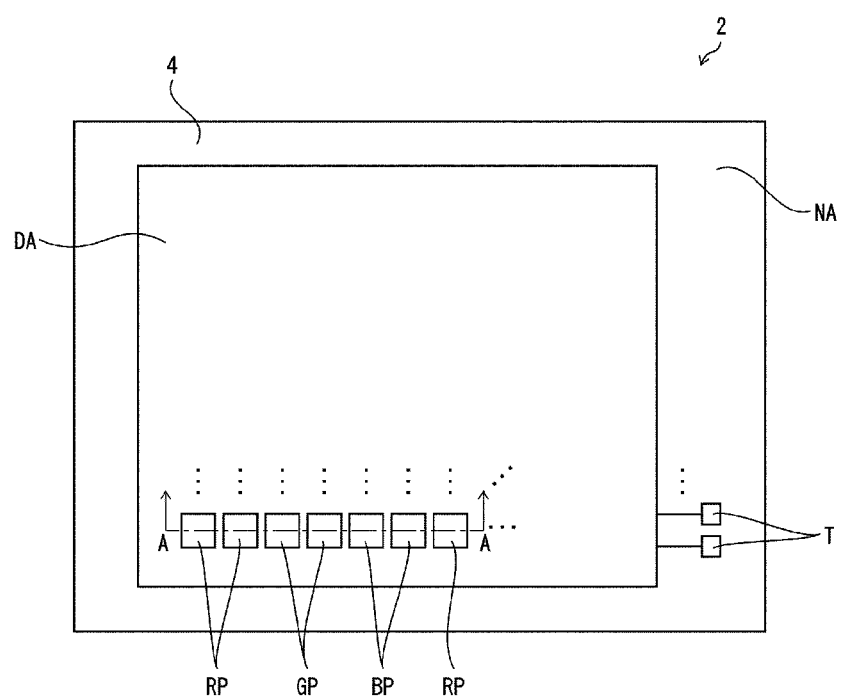

FIG. 2 is a schematic plan view of a display device 2 according to this embodiment. FIG. 1 is a cross-sectional view of the display device 2, viewed along arrows A-A in FIG. 2.

As illustrated in FIG. 2, the display device 2 according to this embodiment includes: a transparent substrate 4; a light-emitting region DA emitting light; and a frame region NA surrounding a periphery of the light-emitting region DA. The light-emitting region DA and the frame region NA are provided above the transparent substrate 4. In the frame region NA, terminals T may be formed on the transparent substrate 4 to receive signals for driving the light-emitting elements of the display device 2. The light-emitting elements will be described later in detail.

As illustrated in FIG. 2, the display device 2 includes, as sub-pixels, a plurality of blue sub-pixels BP, a plurality of green sub-pixels GP, and a plurality of red sub-pixels RP positioned to coincide with the light-emitting region DA in plan view. In this embodiment, the blue sub-pixels BP, the green sub-pixels GP, and the red sub-pixels RP may be arranged in a matrix in the light-emitting region DA.

As illustrated in FIG. 1, the display device 2 according to this embodiment includes a light-emitting-element layer 6 provided in the light-emitting region DA and formed on the transparent substrate 4. The light-emitting-element layer 6 includes: a plurality of first light-emitting elements 6B; a plurality of second light-emitting elements 6G; and a plurality of third light-emitting elements 6R. Each of the first light-emitting elements 6B is formed in one of the blue sub-pixels BP. Each of the second light-emitting elements 6G is formed in one of the green sub-pixels BP. Each of the third light-emitting elements 6R is formed in one of the red sub-pixels RP.

Note that, in this embodiment, a first direction D1 is a normal direction to a planar direction of the transparent substrate 4. The first direction D1 also runs from the light-emitting-element layer 6 toward the transparent substrate 4. Moreover, a second direction D2 is the opposite direction to the first direction D1. In other words, the second direction D2 is a normal direction to the planar direction of the transparent substrate 4. The second direction D2 also runs from the transparent substrate 4 toward the light-emitting-element layer 6. Note that, in this embodiment, the first direction D1 and the second direction D2 may run in opposite directions, and do not have to be limited to the normal directions to the planar direction of the transparent substrate 4.

The light-emitting-element layer 6 includes: a first electrode 8; a second electrode 10; and a light-emitting layer 12 between the first electrode 8 and the second electrode 10.

The first electrode 8 is formed on the transparent substrate 4, and transparent to visible light. The first electrode 8 includes: a first electrode 8B formed in each blue sub-pixel BP; a first electrode 8G formed in each green sub-pixel GP; and a first electrode 8R formed in each red sub-pixel RP.

The second electrode 10 is formed across the first electrode 8 from the transparent substrate 4, and transparent to visible light. Moreover, the second electrode 10 is formed in common between the blue sub-pixels BP, the green sub-pixels GP, and the red sub-pixels RP.

The light-emitting layer 12 includes: a first light-emitting layer 12B formed on each first electrode 8B; a second light-emitting layer 12G formed on each first electrode 8G; and a third light-emitting layer 12R formed on each first electrode 8R. The light-emitting layer 12 is transparent to visible light.

The first light-emitting element 6B includes: the first electrode 8B; the first light-emitting layer 12B; and the second electrode 10. Moreover, the second light-emitting element 6G includes: the first electrode 8G; the second light-emitting layer 12G; and the second electrode 10. Furthermore, the third light-emitting element 6R includes: the first electrode 8R; the third light-emitting layer 12R; and the second electrode 10.

In this embodiment, a certain voltage may be applied to the second electrode 10, and an individual voltage may be applied to each of the first electrodes 8B, the first electrodes 8G, and the first electrodes 8R, in order to drive the light-emitting elements of the light-emitting-element layer 6.

In this embodiment, the first light-emitting layer 12B emits a first light L1 including a light having a first wavelength $\lambda 1$. The first light L1 is generated of an exciton formed by recombination of carriers from the first electrode 8B and the second electrode 10. Hence, the first light-emitting element 6B emits the first light L1 by the driving of the first electrode 8B. In this embodiment, the first light L1 is blue light, and the first wavelength $\lambda 1$ is a peak wavelength of the first light L1.

In this embodiment, the second light-emitting layer 12G emits a second light L2 including a light having a second wavelength $\lambda 2$ that is different from the first wavelength $\lambda 1$. The second light L2 is generated of an excitors formed by recombination of carriers from the first electrode 8G and the second electrode 10. Hence, the second light-emitting element 6G emits the second light L2 by the driving of the first electrode 8G. In this embodiment, the second light L2 is green light, and the second wavelength $\lambda 2$ is a peak wavelength of the second light L2.

In this embodiment, the third light-emitting layer 12R emits a third light L3 including a light having a third wavelength $\lambda 3$ that is different from both the first wavelength $\lambda 1$ and the second wavelength $\lambda 2$. The third light L3 is generated of an exciton formed by recombination of carriers from the first electrode 8R and the second electrode 10. Hence, the third light-emitting element 6R emits the third light L3 by the driving of the first electrode 8R. In this embodiment, the third light L3 is red light, and the third wavelength $\lambda 3$ is a peak wavelength of the third light L3.

In this embodiment, each light-emitting element may include a charge-transport layer at least one of between the first electrode 8 and the light-emitting layer 12 or between the second electrode 10 and the light-emitting layer 12. The charge-transport layer assists transportation of the carriers from the electrodes to the light-emitting layer 12.

In this embodiment, the first electrode 8 and the light-emitting layer 12 of the light-emitting-element layer 6 are divided into the sub-pixels by partition walls 14 formed on the transparent substrate 4. In other words, each of the partition walls 14 divides neighboring light-emitting elements of the light-emitting elements included in the light-emitting-element layer 6. In view of reducing stray light and color mixture of the display device 2, the partition walls 14 preferably reflect or absorb visible light including the first light L1, the second light L2 and the third light L3.

Each of the first electrodes 8 formed in a corresponding one of the sub-pixels may be electrically connected to a corresponding one of thin-film transistors (TFTs) 16 formed on the transparent substrate 4. The first electrodes 8 and the TFTs 16 may be electrically connected together through routed wires 18 formed in the transparent substrate 4.

The display device 2 according to this embodiment further includes: a plurality of first optical layers 20B; a plurality of second optical layers 20G, and a plurality of third optical layers 20R. The first optical layers 20B are formed in the second direction D2 with respect to the first light-emitting elements 6B, and positioned to coincide with the first light-emitting elements 6B in the second direction D2. Moreover, the second optical layers 20G are formed in the second direction D2 with respect to the second light-emitting elements 6G, and positioned to coincide with the second light-emitting elements 6G in the second direction D2. Furthermore, the third optical layers 20R are formed in the second direction D2 with respect to the third light-emitting elements 6R, and positioned to coincide with the third light-emitting elements 6R in the second direction D2.

Note that the display device 2 may further include a sealing layer above the first optical layers 20B, the second optical layers 20G, the third optical layers 20R, and the second electrode 10. The sealing layer may be transparent to visible light. On the transparent substrate 4, the sealing layer may seal the light-emitting elements included in the light-emitting-element layer 6.

Figure 3:
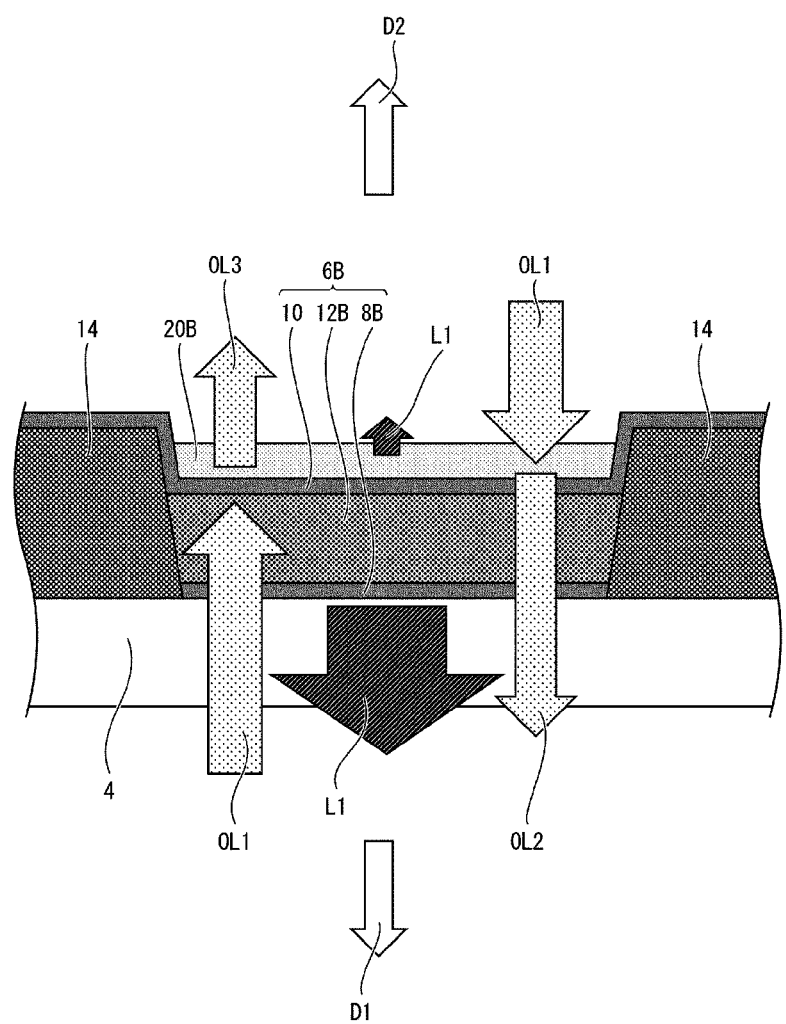

Described here in detail are how each of the first optical layers 20B works and how each of the first light-emitting elements 6B releases the first light L1, with reference to FIGS. 3 to 6. FIG. 3 is an enlarged cross-sectional view of a region B in FIG. 1. In other words, FIG. 3 is an enlarged cross-sectional view of the display device 2. The Toss-sectional view shows the first light-emitting element 6B and its surroundings.

Figure 4:
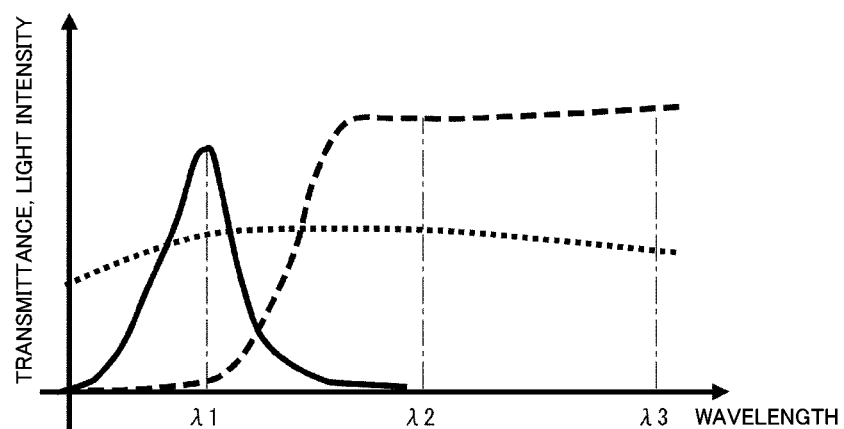

FIG. 4 is a graph showing, for each of the wavelengths, intensity of the first light L1 from the first light-emitting element 6B of the display device 2, intensity of an outside light OL1 incident from outside on the display device 2, and absorptivity of the first optical layer 20B. In FIG. 4, the solid line indicates the intensity of the first light L1 from the first light-emitting element 6B. The dotted line indicates the intensity of the outside light OL1. The broken line indicates the absorptivity of the first optical layer 20B.

Figure 5:
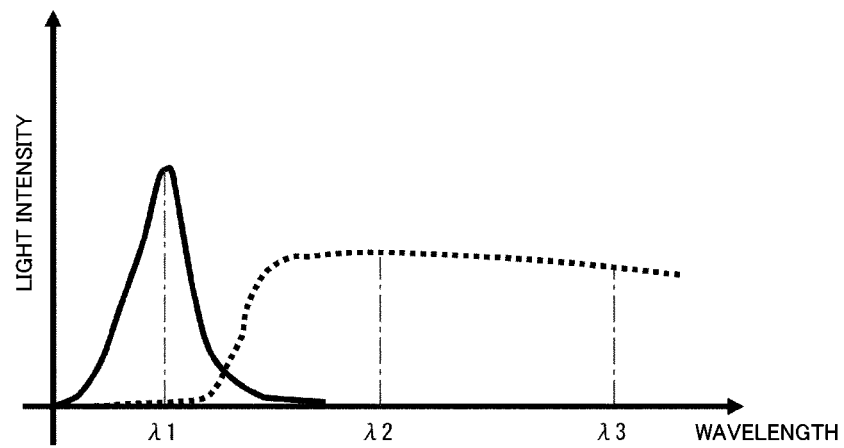

FIG. 5 is a graph showing, for each of the wavelengths, intensity of the first light L1 emitted from the first light-emitting element 6B and released from the display device 2 in the first direction D1, and intensity of an outside light OL2, of the outside light OL1 incident in the first direction D1 on the display device 2, passing through the first light-emitting element 6B. In FIG. 5, the solid line indicates the intensity of the first light L1 emitted from the first light-emitting element 6B and released in the first direction D1. The dotted line indicates the intensity of the outside light OL2.

Figure 6:
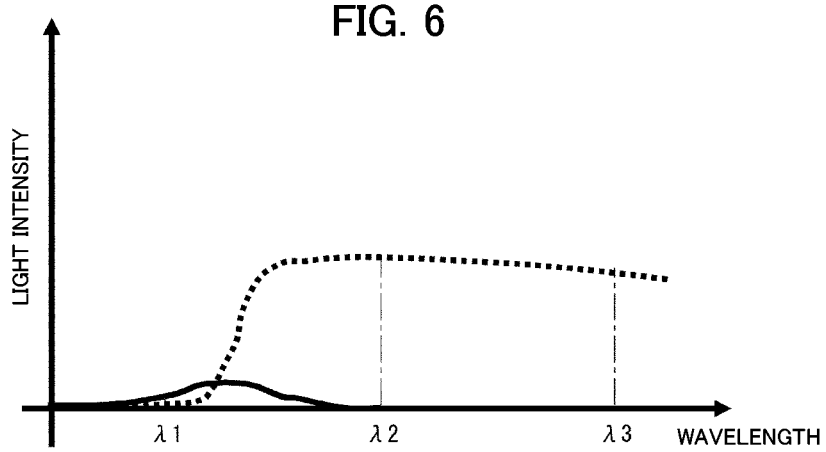

FIG. 6 is a graph showing, for each of the wavelengths, intensity of the first light L1 emitted from the first light-emitting element 6B and released from the display device 2 in the second direction D2, and intensity of an outside light OL3, of the outside light OL1 incident in the second direction D2 on the display device 2, passing through the first light-emitting element 6B. In FIG. 5, the solid line indicates the intensity of the first light L1 emitted from the first light-emitting element 6B and released in the second direction D2. The dotted line indicates the intensity of the outside light OL3.

As can be seen, the first light L1 includes a light having the first wavelength $\lambda 1$. The first wavelength $\lambda 1$ is the peak wavelength of the first light L1. Hence, as indicated by the solid line in FIG. 4, of the first light L1, the light whose wavelength is close to the first wavelength $\lambda 1$ is high in intensity.

The outside light 1 is, for example, a substantially white light including sunlight or white light from an electric appliance. Hence, as indicated by the dotted line in FIG. 4, the outside light OL1 includes light components of such wavelengths as the first wavelength $\lambda 1$, the second wavelength $\lambda 2$, and the third wavelength $\lambda 3$ in the wavelength region of the visible light.

Here, as indicated by the broken line in FIG. 4, the first optical layer 20B is rarely transparent to a light having the first wavelength $\lambda 1$. In other words, the first optical layer 20B is reflective or absorptive of the light having the first wavelength $\lambda 1$. Hence, the first optical layer 20B at least partially reflects or absorbs the first light L1. Meanwhile, the first optical layer 20B is transparent to both of lights having the second wavelength $\lambda 2$ and the third wavelength $\lambda 3$. For example, the first optical layer 20B is reflective or absorptive of blue light, and is transparent to green light and red light. For example, the first optical layer 20B preferably reflects or absorbs a light included in the first light L1 and having the peak wavelength.

In this embodiment, the first light L1 from the first light-emitting element 6B is emitted in directions including the first direction D1 and the second direction D2. Here, the first light L1 emitted from the first light-emitting element 6B in the first direction D1 passes through the first electrode 8B and the transparent substrate 4. Hence, as indicated by the solid line in FIG. 5, the first light L1 emitted from the first light-emitting element 6B in the first direction D1 is released out of the display device 2, maintaining light intensity of, and close to, the first wavelength $\lambda 1$.

Meanwhile, the first light L1 emitted from the first light-emitting element 613 in the second direction D2 would pass through the second electrode 10. However, the first light L1 is reflected on, or absorbed into, the first optical layer 20B. Hence, the first light L1 does not pass through the first optical layer 20B. Hence, as indicated by the solid line in FIG. 6, most of the first light L1 emitted from the first light-emitting element 6B in the first direction D2 is not emitted out of the display device 2, including the light having the first wavelength $\lambda 1$.

Hence, as illustrated in FIGS. 1 to 3, the display device 2 releases the first light L1 from the first light-emitting element 6B mainly in the first direction D1. In other words, the display device 2 does not release the first light L1 from the first light-emitting element 6B in the second direction D2.

Here, of the outside light OL1 incident in the first direction D1 on the display device 2, the outside light OL1 incident on the first light-emitting element 6B sequentially passes through the first optical layer 20B, the first light-emitting element 6B, and the transparent substrate 4. Moreover, when the outside light OIL passes through the first optical layer 20B, a light included in the outside light OL1 is absorbed. The absorbed light has the first wavelength $\lambda 1$ and a wavelength close to the first wavelength $\lambda 1$.

Hence, as indicated by the dotted line in FIG. 5, of the outside light OL1 incident in the first direction D1 on the display device 2, the outside light OL2 passing through the first light-emitting element 6B has intensity not close to the first wavelength $\lambda 1$ but close to the second wavelength $\lambda 2$ and the third wavelength $\lambda 3$. If the light having the second wavelength λ2 is green and the light having the third wavelength λ3 is red, the outside light OL2 is, for example, substantially yellow.

Moreover, of the outside light OL1 incident in the second direction D2 on the display device 2, the outside light OL1 incident on the first light-emitting element 6B sequentially passes through the transparent substrate 4, the first light-emitting element 6B, and the first optical layer 20B. In this case, too, when the outside light OL1 passes through the first optical layer 20B, a light included in the outside light OL1 is absorbed. The absorbed light has the first wavelength λ1 and a wavelength close to the first wavelength λ1.

Hence, as indicated by the dotted line in FIG. 6, of the outside light OL1 incident in the second direction D2 on the display device 2, the outside light OL3 passing through the first light-emitting element 6B has intensity not close to the first wavelength λ1 but close to the second wavelength λ2 and the third wavelength λ3. Hence, the outside light OL2 and the outside light OL3, both passing through the first light-emitting element 6B, have substantially the same component.

Thus, the display device 2 releases the first light L1 from the first light-emitting element 6B in the first direction D1, and, simultaneously, allows the outside lights to pass through the first light-emitting element 6B in both the first direction D1 and the second direction D2.

Similar to the first optical layer 20B, the second optical layer 20G is rarely transparent to a light having the second wavelength λ2. In other words, the second optical layer 20G is reflective or absorptive of the light having the second wavelength λ2. Hence, the second optical layer 20G at least partially reflects or absorbs the second light L2. Meanwhile, the second optical layer 20G is transparent to both of lights having the first wavelength λ1 and the third wavelength λ3. For example, the second optical layer 20G is reflective or absorptive of green light, and is transparent to blue light and red light. For example, the second optical layer 20G preferably reflects or absorbs light included in the second light L2 and having the peak wavelength.

Hence, because of the same reasons described above, as illustrated in FIG. 1, the display device 2 releases the second light L2 from the second light-emitting element 6G mainly in the first direction D1. In other words, the display device 2 does not release the second light L2 from the second light-emitting element 6G in the second direction D2.

Moreover, because of the same reasons described above, of the outside light OL1 incident in the first direction D1 on the display device 2, the outside light OL2 passing through the second light-emitting element 6G has intensity not close to the second wavelength λ2 but close to the first wavelength λ1 and the third wavelength λ3. If the light having the first wavelength λ1 is blue and the light having the third wavelength λ3 is red, the outside light OL2 is, for example, substantially magenta.

Moreover, because of the same reasons described above, of the outside light OL1 incident in the second direction D2 on the display device 2, the outside light OL3 passing through the second light-emitting element 6G has intensity not close to the second wavelength λ2 but close to the first wavelength λ1 and the third wavelength λ3. Hence, the outside light OL2 and the outside light OL3, both passing through the second light-emitting element 6G, have substantially the same component.

In addition, the third optical layer 20R is rarely transparent to a light having the third wavelength λ3. In other words, the third optical layer 20R is reflective or absorptive of the light having the third wavelength λ3. Hence, the third optical layer 20R at least partially reflects or absorbs the third light L3. Meanwhile, the third optical layer 20R is transparent to both of lights having the first wavelength λ1 and the second wavelength λ2. For example, the third optical layer 20R is reflective or absorptive of red light, and is transparent to blue light and green light. For example, the third optical layer 20R preferably reflects or absorbs light included in the third light L3 and having the peak wavelength.

Hence, because of the same reasons described above, as illustrated in FIG. 1, the display device 2 releases the third light L3 from the third light-emitting element 6R mainly in the first direction D1. In other words, the display device 2 does not release the third light L3 from the third light-emitting element 6R in the second direction D2.

Moreover, because of the same reasons described above, of the outside light OL1 incident in the first direction D1 on the display device 2, the outside light OL2 passing through the third light-emitting element 6R has intensity not close to the third wavelength λ3 but close to the first wavelength λ1 and the second wavelength λ2. If the light having the first wavelength λ1 is blue and the light having the second wavelength λ2 is green, the outside light OL2 is, for example, substantially cyanogen.

Moreover, because of the same reasons described above, of the outside light OL1 incident in the second direction D2 on the display device 2, the outside light OL3 passing through the third light-emitting element 6R has intensity not close to the third wavelength λ3 but close to the first wavelength λ1 and the second wavelength λ2. Hence, the outside light OL2 and the outside light OL3, both passing through the second light-emitting element 6G, have substantially the same component.

Hence, the display device 2 according to this embodiment releases, in the first direction D1, the second light L2 from the second light-emitting element 6G and the third light L3 from the third light-emitting element 6R. Moreover, the display device 2 according to this embodiment allows the outside lights to pass through the second light-emitting element 6G and the third light-emitting element 6R in both the first direction D1 and the second direction As can be seen, when the display device 2 according to this embodiment is observed from toward the first direction with respect to the transparent substrate 4, the first light L1, the second light L2, and the third light L3 from the light-emitting elements are observed. In addition, the outside light OL2 passing through the light-emitting elements is also observed.

Here, the outside light OL2 passing through the first light-emitting element 6B has intensity in the second wavelength λ2 and the third wavelength λ3. Moreover, the outside light OL2 passing through the second light-emitting element 6G has intensity in the first wavelength λ1 and the third wavelength λ3. Furthermore, the outside light OL2 passing through the third light-emitting element 6R has intensity in the first wavelength λ1 and the second wavelength λ2.

Hence, the outside light OL2 passing through the first light-emitting element 6B the outside light OL2 passing through the second light-emitting element 6G, and the outside light OL2 passing through the third light-emitting element 6R are synthesized into the outside light OL2 having substantially the same intensity in the first wavelength λ1, the second wavelength λ2, and the third wavelength λ3. Hence, when the display device 2 is observed from toward the first direction D1 with respect to the transparent substrate 4 in order to observe the light into which the outside lights OL2 passing through the light-emitting elements are synthesized, the observed light is the outside light OL2 passing through the display device 2 with the white balance adjusted.

Note that, as described above, the outside light OL3 passing through the light-emitting elements has substantially the same component as the light OL2 corresponding to the outside light OL3 has. Hence, when the display device 2 is observed from toward the second direction D2 with respect to the transparent substrate 4 in order to observe the light into which the outside lights OL3 passing through the light-emitting elements are synthesized, the observed light is the outside light OL3 passing through the display device 2 with the white balance adjusted.

In this embodiment, the display device 2 releases the lights from the light-emitting elements in the first direction D1, and, simultaneously, allows the outside lights with the white balance adjusted to pass through the light-emitting elements in both the first direction D1 and the second direction D2. In other words, the display device 2 allows the outside lights to pass through in both the first direction 1 and the second direction D2, without a transparent region to be provided separately from a region in which the light-emitting elements are formed and to include, for example, a clearance allowing the outside lights to pass through.

Note that, as described above in this embodiment, the light from the light-emitting elements is rarely released in the second direction D2. Hence, this embodiment keeps the light, released from the light-emitting elements in the first direction D1 from leaking in the second direction D2 in which the light is not usually expected to be released.

As can be seen, the display device 2 according to this embodiment can obtain more efficiently a region through which outside light passes, while obtaining a region releasing light from the light-emitting elements. Hence, the display device 2 according to this embodiment can simultaneously achieve high luminance and high light-transparency more efficiently. The display device 2 according to this embodiment can be of a bottom-emission type to release the light from the light-emitting elements toward the transparent substrate 4.

Note that this embodiment describes an example in which the display device 2 includes: the first light-emitting elements 6B emitting the first light L1 colored blue; the second light-emitting elements 6G emitting the second light L2 colored green; and the third light-emitting elements 6R emitting the third light L3 colored red. However, the display device 2 shall not be limited to the above example. The display device 2 may, for example, include at least the first light-emitting elements 6B emitting the first L1 and the second light-emitting elements 6G emitting the second light L2.

In such a case, the display device 2 can release both the first light L1 and the second light L2 in the first direction D1, while allowing the outside light, having intensity in both the first wavelength λ1 and the second wavelength λ2, to pass through in both the first direction D1 and the second direction D2. Hence, also in the above case, the display device 2 according to this embodiment can simultaneously achieve high luminance and high light-transparency more efficiently.

Preferably, in this embodiment, the first wavelength λ1 is the peak wavelength of the first light L1, the second wavelength λ2 is the peak wavelength of the second light L2, and the third wavelength λ3 is the peak wavelength of the third light L3. Thanks to such a feature, the first optical layers 20B, the second optical layers 20G, and the third optical layers 20R respectively and efficiently absorb or reflect the first light L1, the second light L2, and the third light L3.

In this embodiment, as illustrated in FIG. 1, the TFTs 16 are preferably formed in positions to coincide with none of the first light-emitting elements 6B, the second light-emitting elements 6G, or the third light-emitting elements 6R in the first direction D1. Such a feature can reduce influence of the TFTs 16 on the first light L1, the second light L2, and the third light L3 respectively released from the first light-emitting elements 6B, the second light-emitting elements 6G, and the third light-emitting elements 6R. Moreover, the routed wires 18 are preferably transparent to visible light.

In particular, in this embodiment, as illustrated in FIG. 1, the TFTs 16 are preferably formed in positions to coincide with the partition walls 14 in the first direction D1. Thanks to such a feature, the TFTs 16 are easily formed in position to coincide with none of the first light-emitting elements 6B, the second light-emitting elements 6G, or the third light-emitting elements 6R in the first direction D1. In particular, if the partition walls 14 reflect or absorb visible light, the TFTs 16 are less likely to influence the light to be released from the light-emitting elements because of the above feature.

Figure 7:
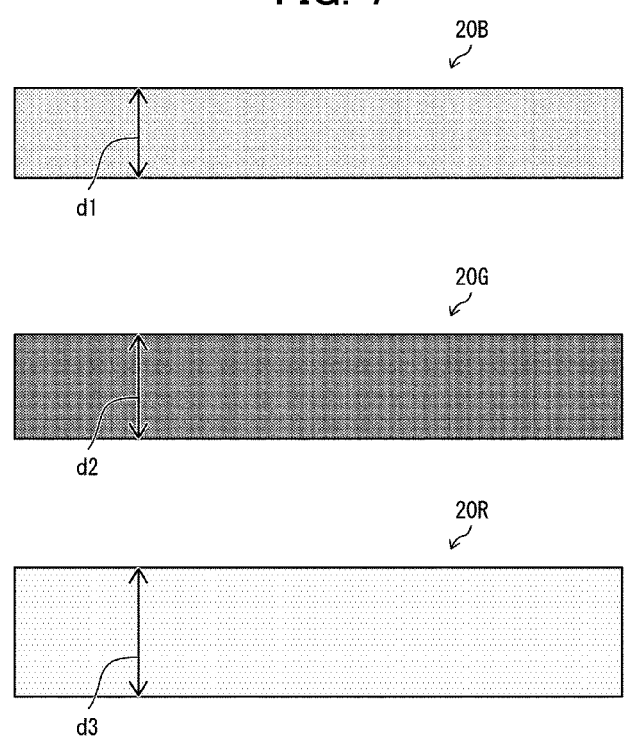
FIG. 7 shows enlarged cross-sectional views showing an example of a first optical layer, a second optical layer, and a third optical layer according to the first embodiment of the disclosure.

Described next are detailed configurations of a first optical layer 20B, a second optical layer 20G, and a third optical layer 20R, with reference to FIG. 7. FIG. 7 shows enlarged cross-sectional views showing an example of the first optical layer 20B, the second optical layer 20G, and the third optical layer 20R.

As illustrated in FIG. 7, the first optical layer 20B has a thickness d1, the second optical layer 20G has a thickness d2, and the third optical layer 20R has a thickness d3. Here, in this embodiment, the thickness d1, the thickness d2, and the thickness d3 are different from one another. Moreover, in this embodiment, the first optical layer 20B has an absolute refractive index n1, the second optical layer 20G has an absolute refractive index n2, and the third optical layer 20R has an absolute refractive index n3.

Here, in this embodiment, the absolute refractive indexes n1, n2, and n3 of the respective optical layers are assumed to be higher than each of the absolute refractive indexes of layers in contact with the optical layers in the first direction D1 and the second direction D2. For example, if a sealing layer is formed on each of the optical layers as described above, the absolute refractive indexes n1, n2, and n3 are higher than the absolute refractive indexes of both the second electrode 10 and the sealing layer.

Here, preferably, the thickness d1, the thickness d2, and the thickness d3 are respectively expressed by an expression (1), an expression (2), and an expression (3) below.

$$d1 = (2m1+1)\lambda 1/4n1 \tag{1}$$

$$d2 = (2m2+1)\lambda 2/4n2 \tag{2}$$

$$d3 = (2m3+1)\lambda 3/4n3 \tag{3}$$

where m1, m2 and m3 are any given integers.

If the expressions (1), (2), and (3) hold, each of the optical layers exhibits light interference; that is, the light having the first wavelength λ1 the light having the second wavelength λ2, and the light having the third wavelength λ3 increase in intensity when reflected in the respective optical layers, and decrease in intensity when passing through the respective optical layers. Hence, if the above expressions hold, the first light L1, the second light L2, and the third light L3 are reflected more efficiently in the respective optical layers.

Meanwhile, in this embodiment, the absolute refractive indexes n1, n2, and n3 of the respective optical layers are assumed to be higher than the absolute refractive index of one of the layers, and lower than the absolute refractive index of the other one of the layers, in contact with the optical layers in the first direction D1 and the second direction D2. For example, if a sealing layer is formed on each of the optical layers as described above, the absolute refractive indexes n1, n2, and n3 are higher than the absolute refractive index of the sealing layer, and lower than the absolute refractive index of the second electrode 10.

Here, preferably, the thickness d1, the thickness d2, and the thickness d3 are respectively expressed by an expression (4), an expression (5), and an expression (6) below.

$$d1 = m1 \cdot \lambda 1 / 2n1 \quad (4)$$

$$d2 = m2 \cdot \lambda 2 / 2n2 \quad (5)$$

$$d3 = m3 \cdot \lambda 3 / 2n3 \quad (6)$$

If the expressions (4), (5), and (6) hold, each of the optical layers exhibits light interference; that is, the light having the first wavelength λ1, the light having the second wavelength λ2, and the light having the third wavelength λ3 increase in intensity when reflected in the respective optical layers, and decrease in intensity when passing through the respective optical layers. Hence, if the above expressions hold, the first light L1, the second light L2, and the third light L3 are reflected more efficiently in the respective optical layers.

In this embodiment, each of the first optical layer 20B, the second optical layer 20G, and the third optical layer 20R may contain a pearl pigment. In such a case, the pearl pigment is designed preferably for each of the light-emitting layers so that each pearl pigment in the corresponding light-emitting layer causes light interference in which the light having the first wavelength the light having the second wavelength λ2, and the light having the third wavelength λ3 increase in intensity when reflected in the respective light-emitting layers. Hence, the first light L1, the second light L2, and the third light L3 are reflected more efficiently in the respective optical layers.

Moreover, in this embodiment, each of the first optical layer 20B the second optical layer 20G, and the third optical layer 20R may contain a coloring agent selectively absorbing a specific wavelength. Specifically, for example, the first optical layer 20B contains a coloring agent absorbing the light having the first wavelength λ1, the second optical layer 20G contains a coloring agent absorbing the light having the second wavelength λ2, and the third optical layer 20R contains a coloring agent absorbing the light having the third wavelength λ3. Thanks to such a feature, the first light L1, the second light L2, and the third light L3 are absorbed more efficiently in the respective optical layers.

In this embodiment, the light-emitting layer 12 is any given light-emitting layer, as long as the light-emitting layer 12 is excited by an excitors formed by recombination of the electrons and the holes injected from outside, and emits light as a light emitter. In particular, in this embodiment, however, the light-emitting layer 12 preferably contains quantum dots (semiconductor nanoparticles) as a light emitter. Compared with another light emitter such as a fluorescent substance or a phosphor, the quantum dots emit light that is relatively narrow in half width from the peak wavelength and that is deep in chromaticity.

Hence, in this embodiment, if the light-emitting layer 12 contains quantum dots as a light emitter, each of the optical layers may be designed to reflect or absorb light included in the light from the quantum dots of the light-emitting layer 12 and having a peak wavelength and a wavelength very close to the peak wavelength. The light from the quantum dots of the light-emitting layer 12 is relatively narrow in half value from the peak wavelength. Thanks to the above design, the optical layer according to this embodiment can reflect or absorb the light from the light-emitting layer 12 more efficiently.

Figure 8:
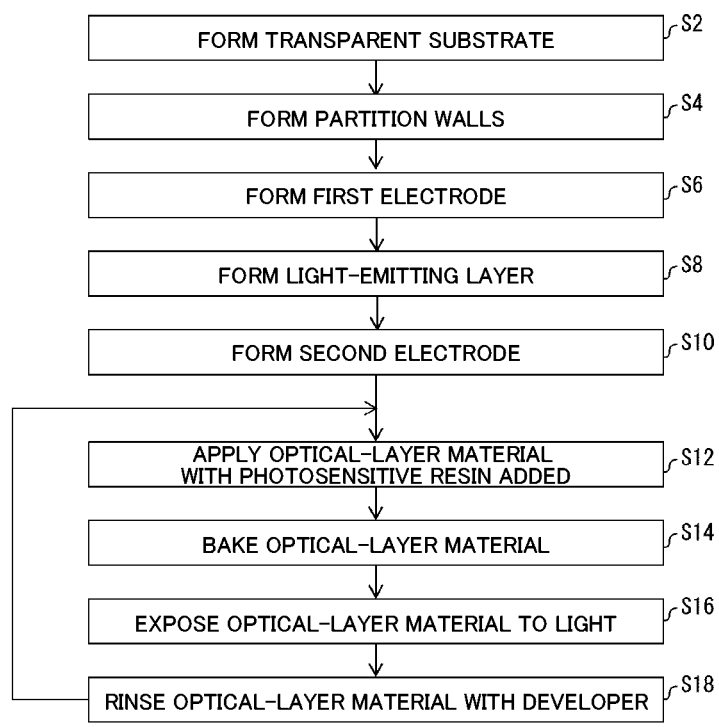
FIG. 8 is a flowchart showing a method for producing the display device according to the first embodiment of the disclosure

Described next is a method for producing the display device 2 according to this embodiment, with reference to FIGS. 8 to 13. FIG. 8 is a flowchart showing the method for producing the display device 2 according to this embodiment. FIGS. 9 to 13 show cross-sectional views to illustrate steps of the method for producing the display device 2 according to this embodiment. Note that the cross-sectional views, including FIGS. 9 to 13 and illustrating the steps in this DESCRIPTION, positionally correspond to the cross-sectional view illustrated in FIG. 1.

In the method for producing the display device 2 according to this embodiment, first, at Step S2, the transparent substrate 4 is formed. At Step S2, the transparent substrate 4 may be provided with the TFTs 16 and the routed wires 18 in addition to the terminals T illustrated in FIG. 2 and wires connected to the terminals T. The TFTs 16 and the routed wires 18 may be formed by a known technique. For example, a conductive material and a semiconductor material are sputtered and patterned to form the TFTs 16 and the routed wires 18. Moreover, because the TFTs 16 and the routed wires 18 are formed at Step S4, a planarization film containing a light-transparent resin material may be formed by slit coating to planarize irregularities on the transparent substrate 4.

At Step S4, the partition walls 14 are formed on the transparent substrate 4. The partition walls 14 may be formed of, for example, a resin material containing a photo-sensitive material. The resin material may be patterned by photolithography to form the partition walls 14.

At Step S6, the first electrode 8 is formed. The first electrode 8 may be formed of, for example, a light-transparent conductive material. The light-transparent conductive material may be formed on the whole surface of the transparent substrate 4 by sputtering, and patterned by, for example, etching to form the first electrode 8. Hence, the first electrodes 8B, the first electrodes 8G, and the first electrodes 8R may be formed at the same step. Other than that, the first electrode 8 may be formed by a known technique. For example, a light-transparent conductive material may be deposited by CVD and patterned to form the first electrode 8.

At Step S8, the light-emitting layer 12 is formed. For example, a material made of a mixture of a light emitter and a photo-sensitive resin is applied. After that, the material may be patterned by photolithography to form the light-emitting layer 12. Such a step may be repeated for each of the colors of light emitters. Other than that, the light-emitting layer 12 may be formed by such known techniques as vapor deposition and ink-jet printing.

At Step S10, the second electrode 10 is formed. For example, a light-transparent conductive material may be formed on top faces of the partition walls 14 and the light-emitting layer 12 by sputtering to obtain the second electrode 10. Hence, the light-emitting-element layer 6 is finned. In other words, the first light-emitting elements 6B, the second light-emitting elements 6G, and the third light-emitting elements 6R are formed.

Next, the first optical layers 20B, the second optical layers 20G, and the third optical layers 20R are formed. Described below is a method for forming the optical layers, showing a method for forming the first optical layers 20B as an example.

First, at Step S12, an optical-layer material 22 is applied to top faces of the first light-emitting elements 6B, the second light-emitting elements 6G, and the third light-emitting elements 6R. The optical-layer material 22 is a mixture of a negative photosensitive resin and a material of the first optical layers 20B. The material of the first optical layers 20B contains a pearl pigment reflecting a light having the first wavelength λ1, or a coloring agent absorbing the light having the first wavelength λ1. The optical-layer material 22 may be applied by such a known technique as ink-jet printing.

At Step S14, the optical-layer material 22 is prebaked. Hence, a prebaked optical-layer material 24 is formed on the top faces of the first light-emitting elements 6B, the second light-emitting elements 6G, and the third light-emitting elements 6R.

At Step S16, the optical-layer material 24 is exposed to light, using a photomask. In this embodiment, the photomask is disposed so that the optical-layer material 24, positioned to coincide with the first light-emitting elements 6B in plan view, is exposed to light. Hence, the first optical layers 20B are obtained in positions to coincide with the first light-emitting elements 6B in plan view.

At Step S18, the optical-layer material 24 is rinsed with an appropriate developer. Here, the first optical layers 20B contain a negative photosensitive material exposed to light, and have insolubility against the developer. Thanks to such a feature, at Step S18-A in FIG. 13, the optical-layer material 24 alone is removed from the top of the light-emitting elements. Thus, the first optical layers 20B alone are left.

Next, the second optical layers 20G and the third optical layers 20R are sequentially formed. The second optical layers 20G and the third optical layers 20R are formed by repetition of Steps S12 to S18 with the optical-layer material 22 modified. In other words, the second optical layers 20G and the third optical layers 20R are formed by the same technique as the first optical layers 20B are, except that kinds and thicknesses of the optical-layer material 22 to be applied at Step S12 are modified, and the position in which the optical-layer material 22 is exposed to light at Step S16 is changed.

Figure 13:
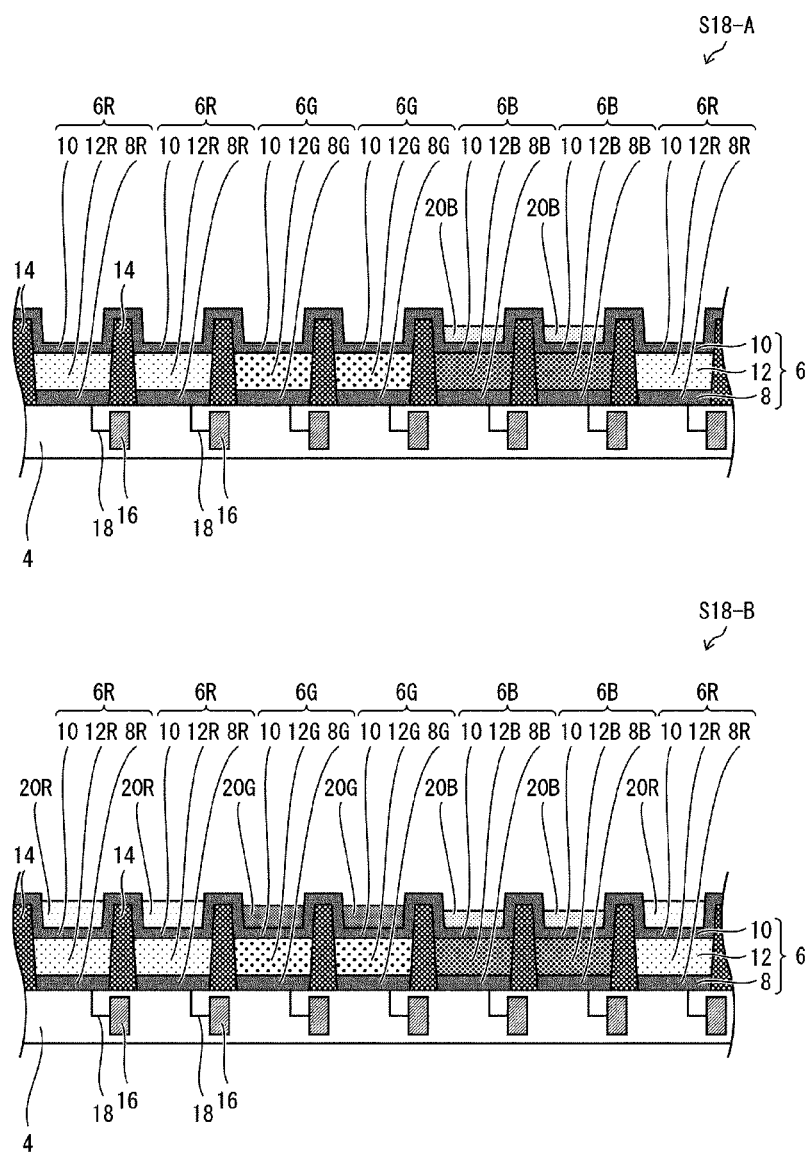
FIG. 13 shows cross-sectional views to illustrate other steps of the method for producing the display device according to the first embodiment of the disclosure.

Hence, as illustrated in Step S18-B in FIG. 13, the first optical layers 20B, the second optical layers 20G, and the third optical layers 20R are formed. Thus, the display device 2 illustrated in FIG. 1 is Obtained. Note that, following the forming of the optical layers, the sealing layer may be formed to seal the light-emitting elements, Modification 1

Figure 14:
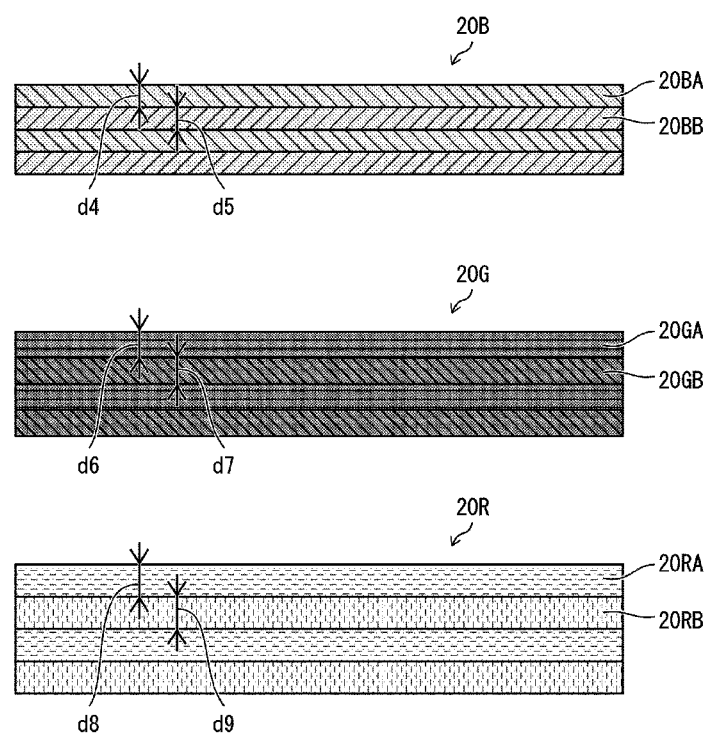
FIG. 14 shows enlarged cross-sectional views showing another example of the first optical layer, the second optical layer, and the third optical layer according to the first embodiment of the disclosure.

FIG. 14 shows enlarged cross-sectional views showing a first optical layer 20B, a second optical layer 20G, and a third optical layer 20R, for showing a modification of the first optical layer 20B, the second optical layer 20G, and the third optical layer 20R according to this embodiment.

The first optical layer 20B according to this modification has a thin-film coating structure including a first high-refractive layer 20BA and a first low-refractive layer 20BB alternately stacked. Both the first high-refractive layer 20BA and the first low-refractive layer 20BB are transparent to light. The first high-refractive layer 20BA is higher in absolute refractive index than the first low-refractive layer 20BB.

Moreover, the first high-refractive layer 20BA has a thickness d4 and an absolute refractive index n4. Furthermore, the first low-refractive layer 20BB has a thickness d5 and an absolute refractive index n5. Here, the thickness d4 and the thickness d5 are respectively expressed by an expression (7) and an expression (8) below.

$$d4=\lambda 1/4n4 \quad (7)$$

$$d5=\lambda 1/4n5 \quad (8)$$

If the expressions (7) and (8) hold, light interference occurs between the first high-refractive layer 20BA and the first low-refractive layer 20BB. In the light interference, the light having the first wavelength λ1 increases in intensity when reflected in the refractive layers, and decreases in intensity when passing through the refractive layers, Hence, if the above expressions (7) and (8) hold, the first light L1 is reflected more efficiently in the first optical layer 20B.

The second optical layer 20G according to this modification has a multilayer structure including a second high-refractive layer 20GA and a second low-refractive layer 20GB alternately stacked. Both the second high-refractive layer 20GA and the second low-refractive layer 20GB are transparent to light. The second high-refractive layer 20GA is higher in absolute refractive index than the second low-refractive layer 20GB.

Moreover, the second high-refractive layer 20GA has a thickness d6 and an absolute refractive index n6. Furthermore, the second low-refractive layer 20GB has a thickness d7 and an absolute refractive index n7 Here, the thickness d6 and the thickness d7 are respectively expressed by an expression (9) and an expression (10) below $$d6=\lambda 2/4n6 \quad (9)$$

$$d7=\lambda 2/4n7 \quad (10)$$

If the expressions (9) and (10) hold, light interference occurs between the second high-refractive layer 20GA and the second low-refractive layer 20GB. In the light interference, the light having the second wavelength λ1 increases in intensity when reflected in the refractive layers, and decreases in intensity when passing through the refractive layers. Hence, if the above expressions (9) and (10) hold, the second light L2 is reflected more efficiently in the second optical layer 20G.

The third optical layer 20R according to this modification has a multilayer structure including a third high-refractive layer 20RA and a third low-refractive layer 20RB alternately stacked. Both the third high-refractive layer 20RA and the third low-refractive layer 20RB are transparent to light. The third high-refractive layer 20RA is higher in absolute refractive index than the third low-refractive layer 20RB.

Moreover, the third high-refractive layer 20RA has a thickness d8 and an absolute refractive index n8. Furthermore, the third low-refractive layer 20RB has a thickness d9 and an absolute refractive index n9, Here, the thickness d8 and the thickness d9 are respectively expressed by an expression (11) and an expression (12) below.

$$d8=\lambda 3/4n8 \quad (11)$$

$$d9=4n9 \quad (12)$$

If the expressions (11) and (12) hold, light interference occurs between the third high-refractive layer 20RA and the third low-refractive layer 20RB. In the light interference, the light having the third wavelength λ3 increases in intensity where reflected in the refractive layers, and decreases in intensity when passing through the refractive layers. Hence, if the above expressions (11) and (12) hold, the third light L3 is reflected more efficiently in the third optical layer 20R.

In each of the optical layers illustrated in FIG. 14, two high-refractive layers and two low-refractive layers are alternately stacked. However, this modification shall not be limited to such a structure. In each optical layer, the more the high-refractive layers and the low-refractive layers are stacked, the higher the advantageous effects of light interference are.

The first optical layer 20B, the second optical layer 20G, and the third optical layer 20R according to this modification may be respectively used instead of the first optical layer 20B, the second optical layer 20G and the third optical layer 20R according to this embodiment. The display device 2 including the first optical layers 20B, the second optical layers 20G, and the third optical layers 20R according to this modification can also simultaneously achieve high luminance and high light-transparency more efficiently.

Figure 9:
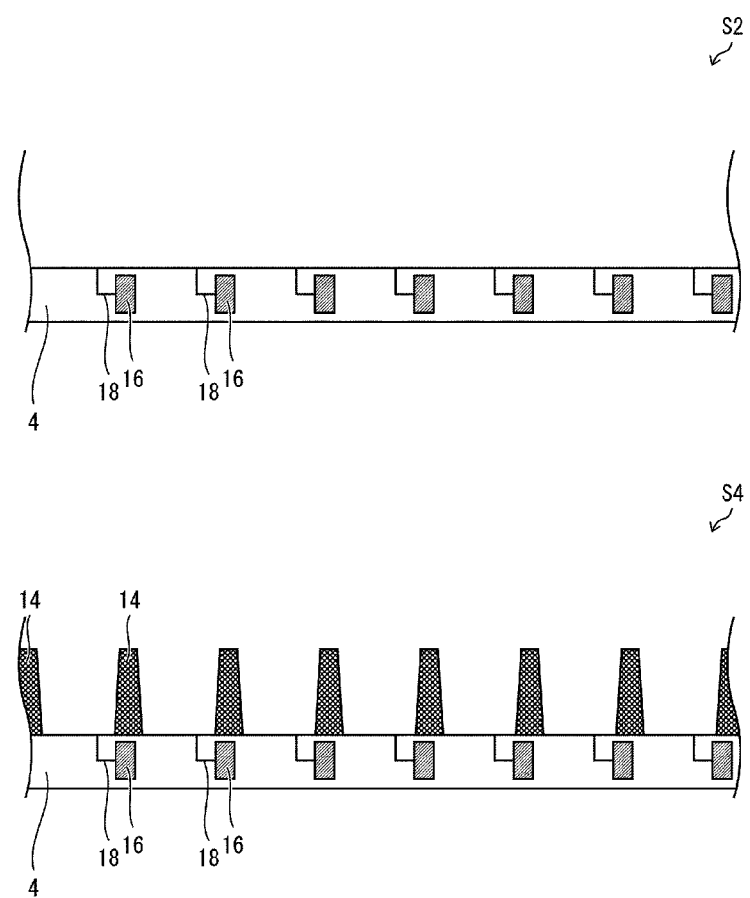
FIG. 9 shows cross-sectional views to illustrate steps of the method for producing the display device according to the first embodiment of the disclosure.
Figure 10:
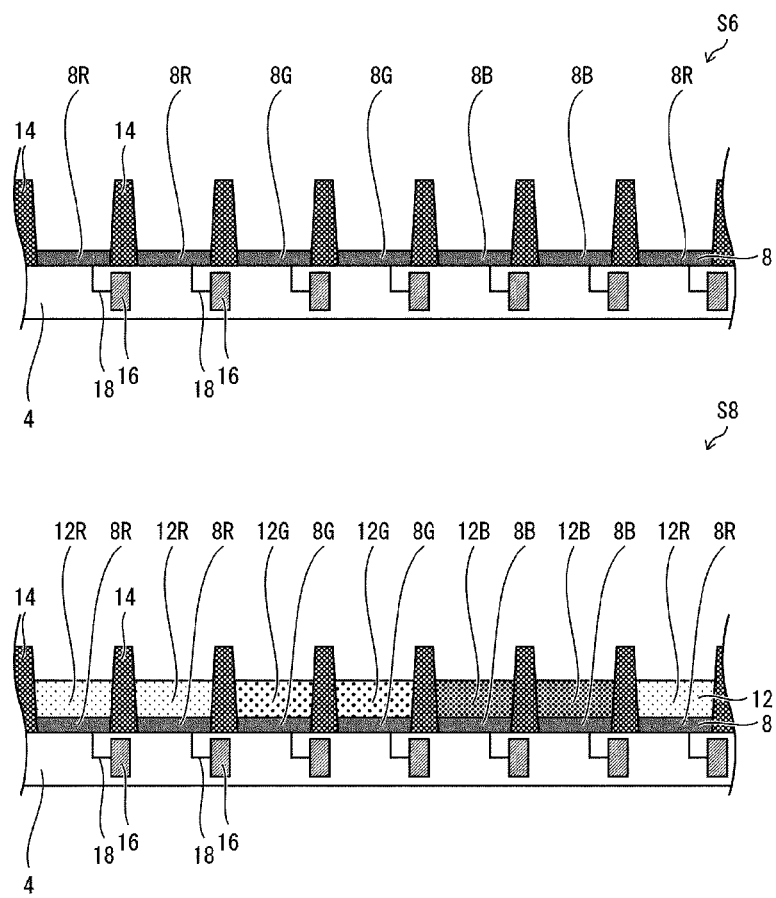
FIG. 10 shows cross-sectional views to illustrate other steps of the method for producing the display device according to the first embodiment of the disclosure.
Figure 11:
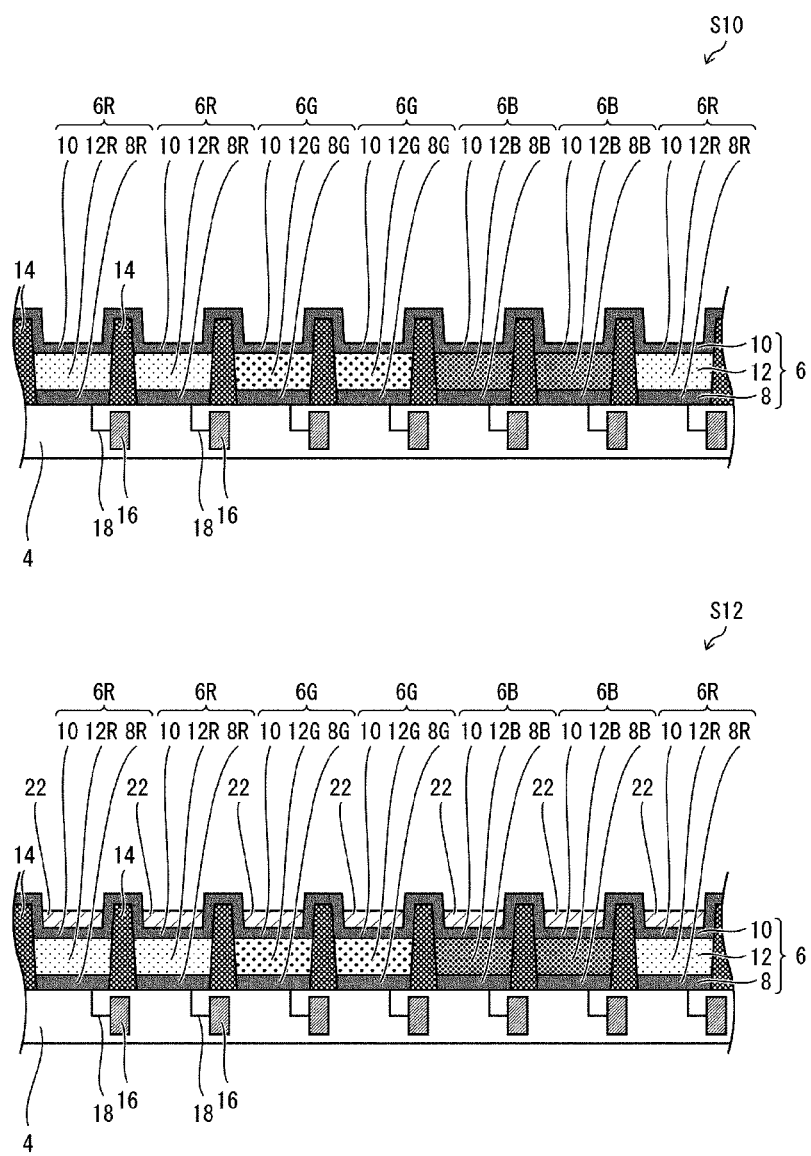
FIG. 11 shows cross-sectional views to illustrate other steps of the method for producing the display device according to the first embodiment of the disclosure.
Figure 12:
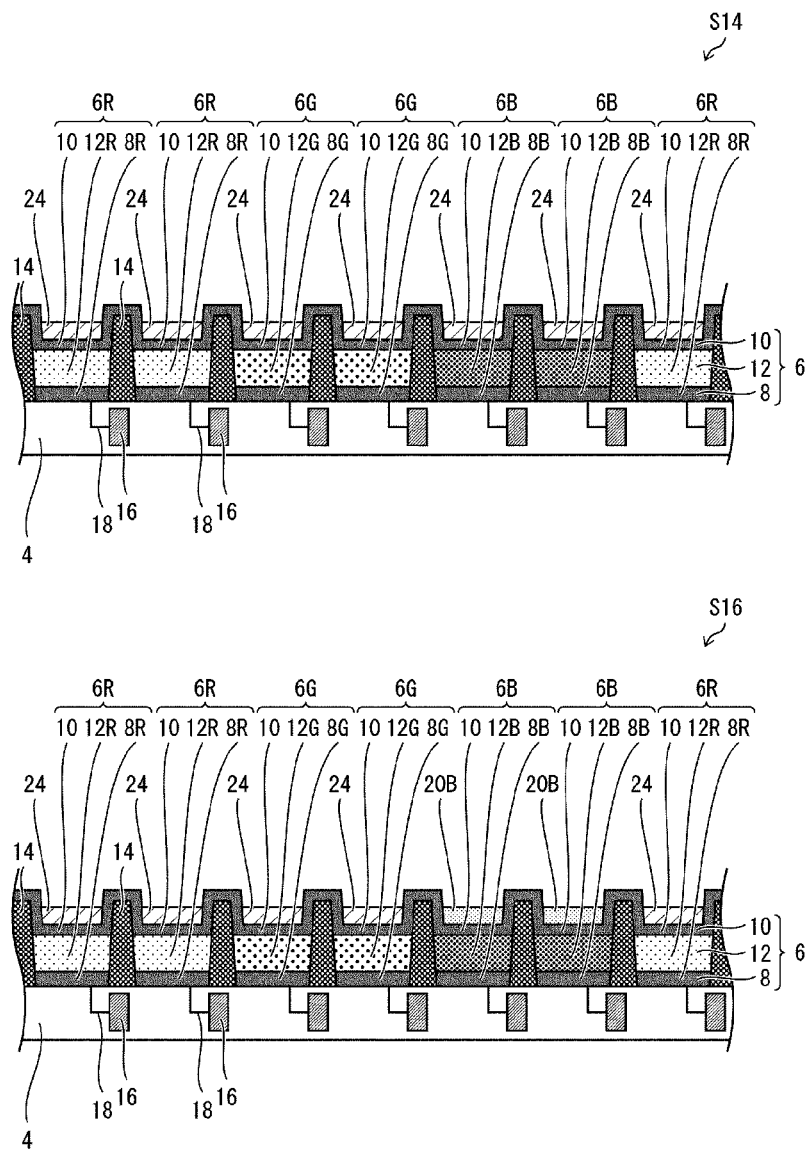
FIG. 12 shows cross-sectional views to illustrate other steps of the method for producing the display device according to the first embodiment of the disclosure

Moreover, the display device 2 including the first optical layers 20B, the second optical layers 20G, and the third optical layers 20R according to this modification can be produced by the steps illustrated in FIG. 9 with Steps S12 to S18 modified. For example, in this modification, each of the first optical layer 20B, the second optical layer 20G, and the third optical layer 20R may be formed of a high-refractive material and a low-refractive material alternately vapor-deposited.

Second Embodiment

Figure 15:
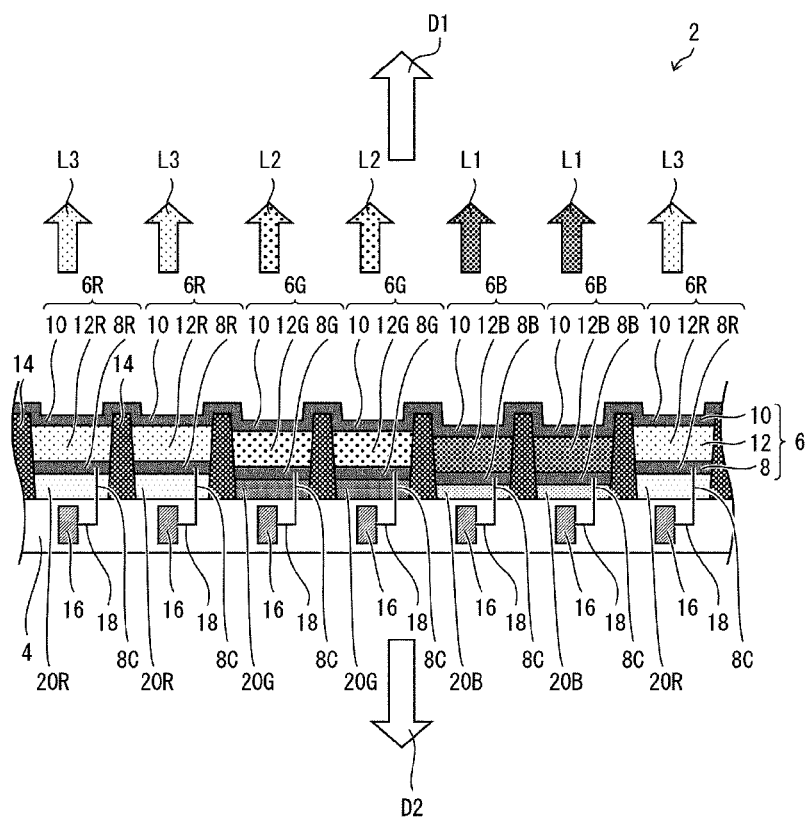
FIG. 15 is a schematic cross-sectional view of the display device according to a second embodiment of the disclosure

FIG. 15 is a schematic cross-sectional view of the display device 2 according to a second embodiment. FIG. 15 is a schematic cross-sectional view, of the display device 2, positionally corresponding to the cross-section of the display device illustrated in FIG. 1. Note that, in this DESCRIPTION, members having identical functions have the same names and reference signs unless otherwise different in configuration. Such members shall not be repeatedly elaborated upon.

The display device 2 according to this embodiment is different from the display device 2 according to the previous embodiment in that the light-emitting-element layer 6, the first optical layers 20B, the second optical layers 20G, and the third optical layers 20R are formed in different positions.

In this embodiment, the first optical layers 20B, the second optical layers 20G, and the third optical layers 20R are formed on the top face of the transparent substrate 4. Moreover, the first light-emitting elements 6B are formed on the top faces of the first optical layers 20B. The second light-emitting elements 6G are formed on the top faces of the second optical layers 20G. The third light-emitting elements 6R are formed on the top faces of the third optical layers 20R.

Here, the first electrodes 8 and the TFTs 16 may be electrically connected together through the routed wires 18, and contact portions 8C formed in contact holes of the optical layers. Note that the contact portions 8C may be formed in the partition walls 14.

Other than the above configuration, the display device 2 according to this embodiment is the same in configuration as the display device 2 according to the previous embodiment.

In this embodiment, the optical layers are formed closer to the transparent substrate 4 than the light-emitting elements are. Hence, light from the light-emitting elements is released in a direction away from the transparent substrate 4. In other words, the first light L1, the second light L2, and the third light L3 are released in the first direction D1. In this embodiment, the first direction D1 is a normal direction to a planar direction of the transparent substrate 4. The first direction D1 also runs from the transparent substrate 4 toward the light-emitting-element layer 6. Moreover, in this embodiment, the second direction D2 is the opposite direction to the first direction D1. In other words, the second direction D2 is a normal direction to the planar direction of the transparent substrate 4. The second direction D2 also runs from light-emitting-element layer 6 toward the transparent substrate 4.

Hence, similar to the display device 2 according to the previous embodiment, the display device 2 according to this embodiment can simultaneously achieve high luminance and high light-transparency more efficiently. Furthermore, the display device 2 according to this embodiment can be of a top-emission type to release the light from the light-emitting elements in the direction away from the transparent substrate 4. Hence, the TFTs 16 and the routed wires 18 are less likely to influence on light released from the light-emitting elements, and the display device 2 according to this embodiment can release the light from the light-emitting elements more efficiently.

In particular, in this embodiment, as illustrated in FIG. 15, even though the TFTs 16 are formed in positions to coincide with the light-emitting elements in the second direction D2, the TFTs 16 are less likely to influence on the light released from the light-emitting elements. Hence, the display device 2 according to this embodiment releases light from the light-emitting elements at sufficient efficiency, and, simultaneously, enhances flexibility in arrangement position of the TFTs 16 and further facilitates designing and production of the transparent substrate 4.

Figure 16:
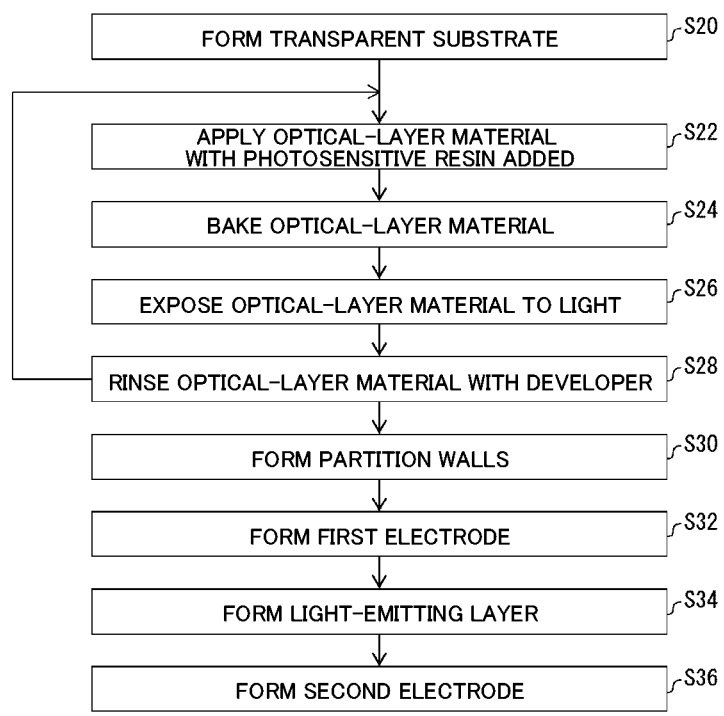
FIG. 16 is a flowchart showing a method for producing the display device according to the second embodiment of the disclosure.
Figure 17:
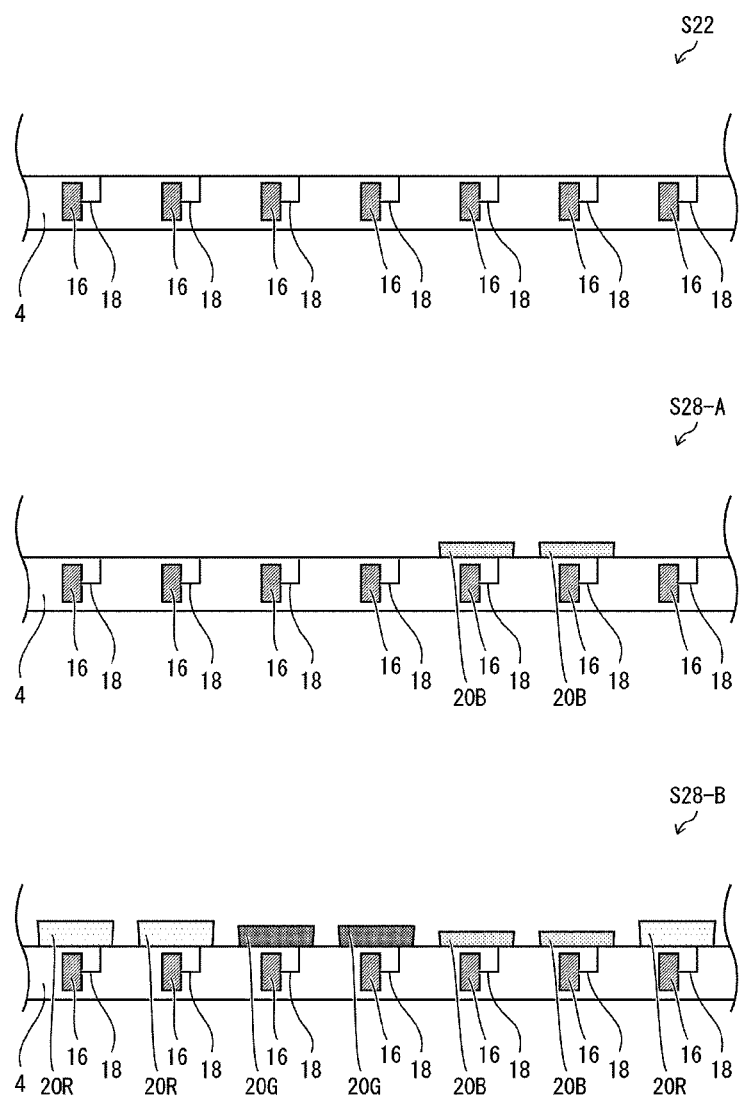
FIG. 17 shows cross-sectional views to illustrate steps of the method for producing the display device according to the second embodiment of the disclosure.
Figure 18:
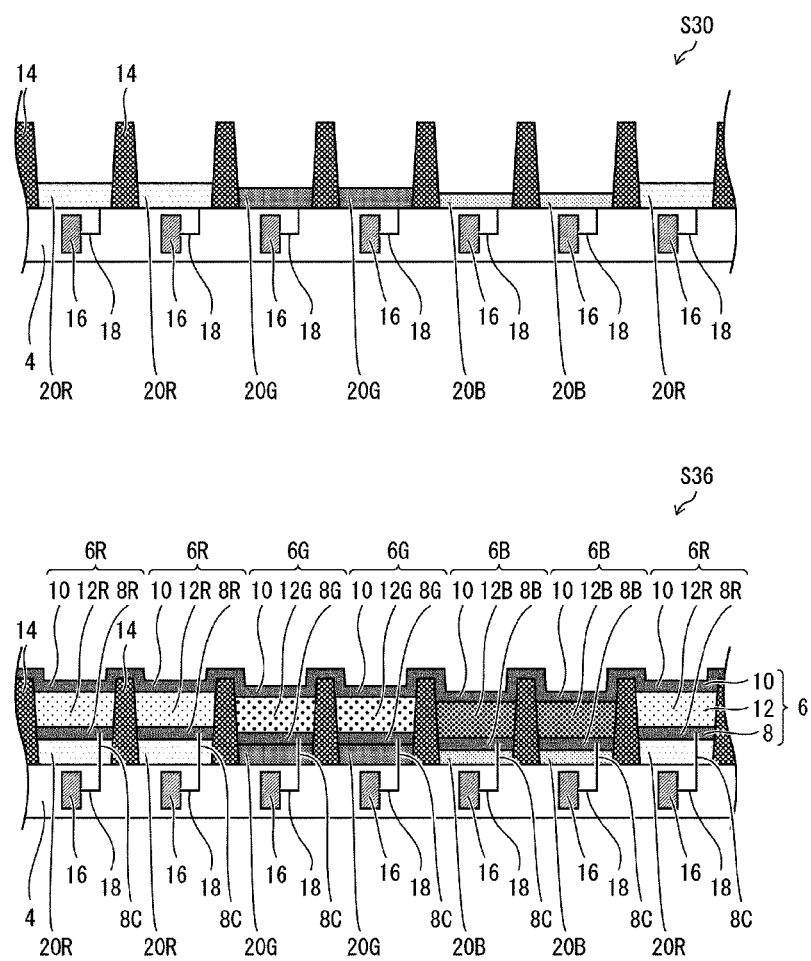
FIG. 18 shows cross-sectional views to illustrate other steps of the method for producing the display device according to the second embodiment of the disclosure.

Described next is a method for producing the display device 2 according to this embodiment, with reference to FIGS. 16 to 18. FIG. 16 is a flowchart showing a method for producing the display device 2 according to this embodiment. FIGS. 17 and 18 show cross-sectional views to illustrate steps of the method for producing the display device 2 according to this embodiment.

In the method for producing the display device 2 according to this embodiment, first, at Step S20, the transparent substrate 4 is formed. Step S20 may be carried out by the same technique as Step S2 of the first embodiment is.

At Step S22, an optical-layer material is applied to the transparent substrate 4. At Step S24, the optical-layer material is prebaked. At Step S26, the prebaked optical-layer material is exposed to light, using a photomask. At Step S28, the optical-layer material is rinsed with an appropriate developer. Steps S22 to S28 may be carried out by the same techniques as Steps S12 to S18 according to the previous embodiment are.

If the optical-layer material is, for example, a mixture of a photosensitive resin and the material of the first optical layers 20B, the first optical layers 20B are formed at the end of Step S28 as illustrated in Step S28-A in FIG. 17. Next, similar to the previous embodiment, at Step S22, kinds and thickness of the optical-layer material 22 are modified. At Step S26, the position in which the optical-layer material 22 is exposed to light is changed. Hence, Steps S22 to S28 are repeatedly carried out. Hence, as illustrated in Step S28-B in FIG. 17, the second optical layers 20G and the third optical layers 20R are formed.

At Step S30, the partition walls 14 are formed on the transparent substrate 4. Step S30 may be carried out by the same technique as Step S4 above is. At Step S32, the first electrode 8 is formed. At Step S34, the light-emitting layer 12 is formed. At Step S36, the second electrode 10 is formed.

Steps S32 to S36 may be carried out by the same techniques as Steps S6 to S10 above are. Hence, the light-emitting-element layer 6 is formed. In other words, the first light-emitting elements 6B, the second light-emitting elements 6G, and the third light-emitting elements 6R are formed. Thus, the display device 2 illustrated in FIG. 15 is obtained. Note that, following the forming of the optical layer 6, the sealing layer may be formed to seal the light-emitting elements.

Third Embodiment

Figure 19:
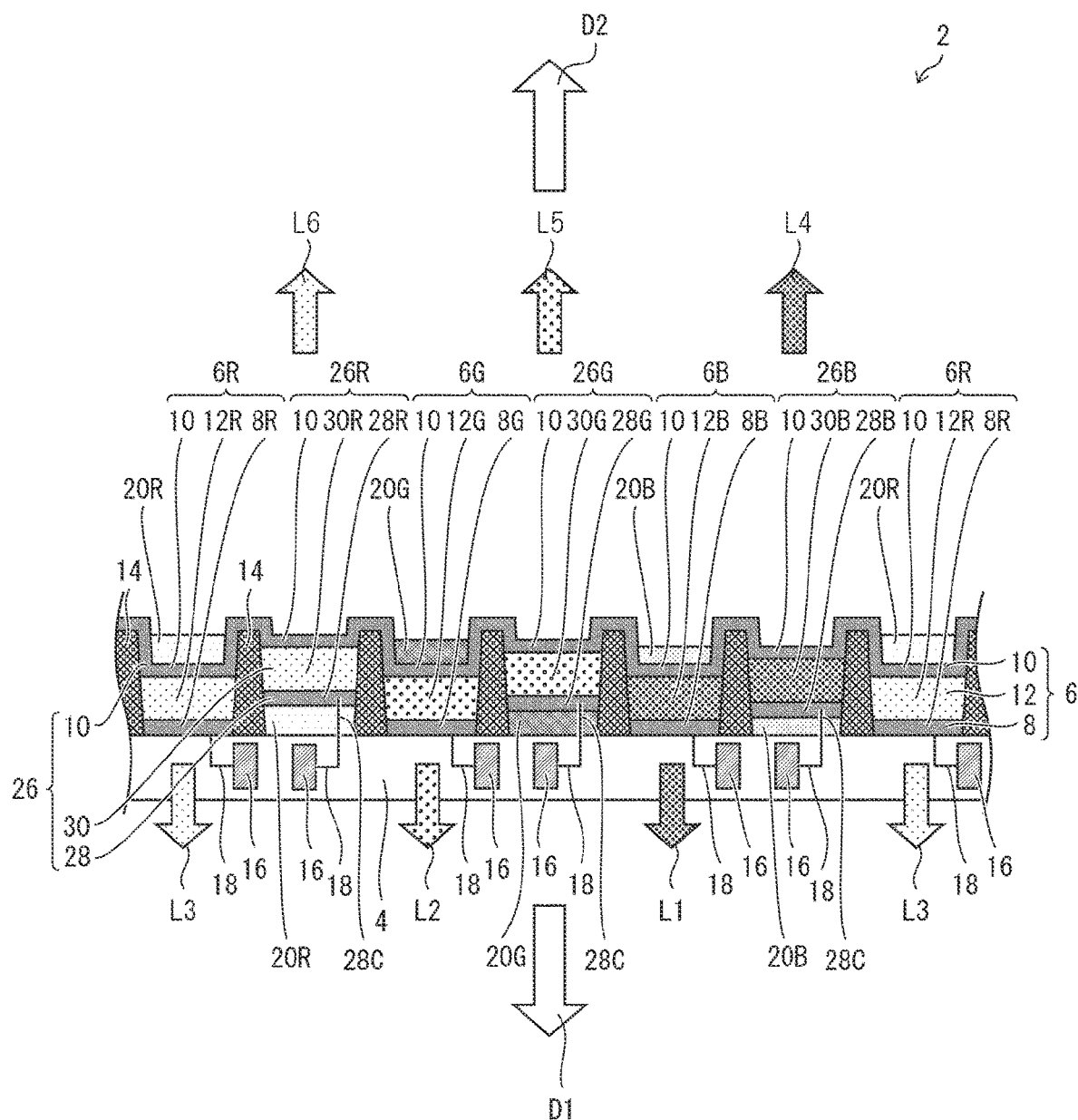
FIG. 19 is a schematic cross-sectional view of the display device according to a third embodiment of the disclosure.

FIG. 19 is a schematic cross-sectional view of the display device 2 according to a third embodiment, FIG. 19 is a schematic cross-sectional view, of the display device 2, positionally corresponding to the cross-section of the display device illustrated in FIG. 1. Note that, in this embodiment, the first direction D1 is a normal direction to a planar direction of the transparent substrate 4, The first direction D1 also runs from the light-emitting-element layer 6 toward the transparent substrate 4. The second direction D2 is the opposite direction to the first direction D1.

The display device 2 according to this embodiment is different in configuration from the display devices 2 according to the first and second embodiments in that the former display device 2 further includes a light-emitting-element layer 26. The light-emitting-element layer 26 includes: a fourth light-emitting element 26B; a fifth light-emitting element 26G; and a sixth light-emitting element 26R, all of which will be described later.

Note that, in this embodiment, each of the first light-emitting element 6B, the second light-emitting element 6G, and the third light-emitting element 6R is formed not in all of the sub-pixels. In particular, in this embodiment, at least one blue sub-pixel BP is provided with the fourth light-emitting element 26B. At least one green sub-pixel GP is provided with the fifth light-emitting element 26G. At least one red sub-pixel RP is provided with the sixth light-emitting element 26R, The light-emitting-element layer 26 includes: a first electrode 28; the second electrode 10; and a light-emitting layer 30 between the first electrode 28 and the second electrode 10. That is, the second electrode 10 is formed in common between both the light-emitting-element layer 6 and the light-emitting-element layer 26.

The first electrode 28 is a transparent electrode transparent to visible light. The first electrode 28 includes: a first electrode 28B formed in each blue sub-pixel BP; a first electrode 28G formed in each green sub-pixel GP; and a first electrode 28R formed in each red sub-pixel RP.

The light-emitting layer 30 includes: a fourth light-emitting layer 30B formed on each first electrode 28B; a fifth light-emitting layer 30G formed on each first electrode 28G; and a sixth light-emitting layer 30R formed on each first electrode 28R. The light-emitting layer 30 is transparent to visible light.

The fourth light-emitting element 26B includes: the first electrode 28B; the fourth light-emitting layer 30B; and the second electrode 10. Moreover, the fifth light-emitting element 26G includes: the first electrode 28G; the fifth light-emitting layer 30G; and the second electrode 10. Furthermore, the sixth light-emitting element 26R includes: the first electrode 28R, the sixth light-emitting layer 30R; and the second electrode 10.

In this embodiment, a certain voltage is applied to the second electrode 10, and an individual voltage is applied to each of the first electrodes 28B, the first electrodes 28G, and the first electrodes 28R, in order to drive the light-emitting elements of the light-emitting-element layer 26.

In this embodiment, the fourth light-emitting layer 30B emits a fourth light L4 including a light having the first wavelength $\lambda 1$. The fourth light L4 is generated of an exciton formed by recombination of carriers from the first electrode 28B and the second electrode 10. Hence, the fourth light-emitting element 26B emits the fourth light L4 by the driving of the first electrode 28B. In this embodiment, the fourth light L4 is blue light, and the first wavelength $\lambda 1$ is a peak wavelength of the fourth light L4.

In this embodiment, the fifth light-emitting layer 30G emits a fifth light L5 including a light having the second wavelength $\lambda 2$ that is different from the first wavelength $\lambda 1$. The fifth light L5 is generated by an exciton formed by recombination of carriers from the first electrode 28G and the second electrode 10. Hence, the fifth light-emitting element 26G emits the fifth light L5 by the driving of the first electrode 28G. In this embodiment, the fifth light L5 is green light, and the second wavelength $\lambda 2$ is a peak wavelength of the fifth light L5.

In this embodiment, the sixth light-emitting layer 30R emits a sixth light L6 including a light having the third wavelength $\lambda 3$ that is different from both the first wavelength $\lambda 1$ and the second wavelength $\lambda 2$. The sixth light L6 is generated of an exciton formed by recombination of carriers from the first electrode 28R and the second electrode 10. Hence, the sixth light-emitting element 26R emits the sixth light L6 by the driving of the first electrode 28R. In this embodiment, the sixth light L6 is red light, and the third wavelength $\lambda 3$ is a peak wavelength of the sixth light L6.

Note that the fourth light L4 may have the same component as that of the first light L1. The fifth light L5 may have the same component as that of the second light L2. The sixth light L6 may have the same component as that of the third light L3.

In this embodiment, each light-emitting element may include a charge-transport layer at least one of between the first electrode 28 and the light-emitting layer 30 or between the second electrode 10 and the light-emitting layer 30. The charge-transport layer assists transportation of the carriers from the electrodes to the light-emitting layer 30.

In this embodiment, the first electrode 28 and the light-emitting layer 30 of the light-emitting-element layer 26 are divided into the sub-pixels by the partition walls 14 formed on the transparent substrate 4. In other words, the partition walls 14 divide neighboring light-emitting elements of the light-emitting elements included in the light-emitting-element layer 6, and additionally divide neighboring light-emitting elements of the light-emitting elements included in the light-emitting-element layer 26. In view of reducing stray light and color mixture of the display device 2, the partition walls 14 preferably reflect or absorb visible light including the fourth light L4, the fifth light L5 and the sixth light L6.

Each of the first electrodes 28 may be electrically connected to a corresponding one of the TFTs 16. The first electrodes 28 and the TFTs 16 may be electrically connected together through the routed wires 18 formed in the transparent substrate 4.

Moreover, the first electrodes 28 and the TFTs 16 may be electrically connected together through the routed wires 18, and contact portions 28C formed in contact holes of the optical layers. Note that the contact portions 28C may be formed in the partition walls 14.

In this embodiment, the first optical layers 20B, the second optical layers 20G, and the third optical layers 20R described above are formed to respectively coincide with the first light-emitting elements 6B, the second light-emitting elements 6G, and the third light-emitting elements 6R in the second direction D2. Hence, similar to the display devices 2 according to the first and second embodiments described above, the display device 2 according to this embodiment releases all of the first light L1 from the first light-emitting elements 6B, the second light L2 from the second light-emitting elements 6G, and the third light L3 from the third light-emitting elements 6R in the first direction D1.

Meanwhile, the first optical layers 20B, the second optical layers 20G, and the third optical layers 20R are formed to respectively coincide with the fourth light-emitting elements 26B, the fifth light-emitting elements 26G, and the sixth light-emitting elements 26R in the first direction D1. That is, the first optical layers 20B, the second optical layers 20G, and the third optical layers 20R are formed on the transparent substrate 4 and positioned to respectively coincide with the fourth light-emitting elements 26B, the fifth light-emitting elements 26G, and the sixth light-emitting elements 26R in the first direction D1.

As described above, each first optical layer 20B reflects or absorbs a light having the first wavelength λ1. Hence, the first optical layer 20B at least partially reflects or absorbs the fourth light L4. Thus, because of the same reasons described above, as illustrated in FIG. 19, the display device 2 releases the fourth light L4 from the third light-emitting element 26B mainly in the second direction D2. In other words, the display device 2 does not release the fourth light L4 from the fourth light-emitting element 26B in the first direction D1.

Moreover, each second optical layer 20G reflects or absorbs a light having the second wavelength 22. Hence, the second optical layer 20G at least partially reflects or absorbs the fifth light L5. Thus, because of the same reasons described above, as illustrated in FIG. 19, the display device 2 releases the fifth light L5 from the fifth light-emitting element 26G mainly in the second direction D2. In other words, the display device 2 does not release the fifth light L5 from the fifth light-emitting element 26G in the first direction D1.

Furthermore, each third optical layer 20R reflects or absorbs a light having the third wavelength λ3. Hence, the third optical layer 20R at least partially reflects or absorbs the sixth light L6. Thus, because of the same reasons described above, as illustrated in FIG. 19, the display device 2 releases the sixth light L6 from the sixth light-emitting element 26R mainly in the second direction D2. In other words, the display device 2 does not release the sixth light L6 from the sixth light-emitting element 26R in the first direction D1.

Here, similar to the first light-emitting element 6B, the second light-emitting element 6G, and the third light-emitting element 6R, the fourth light-emitting element 26B, the fifth light-emitting element 26G, and the sixth light-emitting element 26R are made of a light-transparent material. Hence, the outside light OL1 passes through the fourth light-emitting element 26B, the fifth light-emitting element 26G, and the sixth light-emitting element 26R in both the first direction D1 and the second direction D2.

Note that the outside light OL2 passing through the fourth light-emitting element 26B in the first direction D1 and the outside light OL3 passing through the fourth light-emitting element 26B in the second direction D2 both have intensity not close to the first wavelength λ1 but close to the second wavelength λ2 and the third wavelength λ3.

Moreover, the outside light OL2 passing through the fifth light-emitting element 26G in the first direction D1 and the outside light OL3 passing through the fifth light-emitting element 26G in the second direction D2 both have intensity not close to the second wavelength λ2 but close to the first wavelength λ1 and the third wavelength λ3.

Furthermore, the outside light OL2 passing through the sixth light-emitting element 26R in the first direction D1 and the outside light OL3 passing through the sixth light-emitting element 26R in the second direction D2 both have intensity not close to the third wavelength λ3 but close to the first wavelength λ1 and the second wavelength λ2.

Hence, the display device 2 according to this embodiment releases, in the first direction D1, the first light L1 from the first light-emitting element 6B, the second light L2 from the second light-emitting element 6G, and the third light L3 from the third light-emitting element 6R. Meanwhile, the display device 2 according to this embodiment releases, in the second direction D2, the fourth light L4 from the fourth light-emitting element 26B, the fifth light L5 from the fifth light-emitting element 26G, and the sixth light L6 from the sixth light-emitting element 26R.

Moreover, the display device 2 according to this embodiment allows the outside lights to pass through, in both the first direction D1 and the second direction D2, the first light-emitting element 6B, the second light-emitting element 6G, the third light-emitting element 6R, the fourth light-emitting element 26B, the fifth light-emitting element 26G, and the sixth light-emitting element 26R.

Here, the outside lights OL2 passing through the light-emitting elements are synthesized into the outside light OL2 having substantially the same intensity in the first wavelength the second wavelength λ2, and the third wavelength λ3. Likewise, the outside lights OL3 passing through the light-emitting elements are synthesized into the outside light OL3 having substantially the same intensity in the first wavelength the second wavelength λ2, and the third wavelength λ3. Hence, when the display device 2 is observed from toward the first direction D1 and the second direction D2 with respect to the transparent substrate 4, observed are the outside light OL2 and the outside light OL3 each passing through the display device 2 with the white balance adjusted.

In this embodiment, the display device 2 releases the lights from the light-emitting elements in the first direction D1 and the second direction D2, and, simultaneously, allows the outside lights with the white balance adjusted to pass through the light-emitting elements in both the first direction D1 and the second direction D2, In other words, the display device 2 allows the outside lights to pass through in both the first direction D1 and the second direction D2, without a transparent region to be provided separately from a region in which the light-emitting elements are formed and to include, for example, a clearance allowing the outside lights to pass through.

As can be seen, similar to the display devices 2 according to the first and second embodiments, the display device 2 according to this embodiment can obtain more efficiently a region through which outside light passes through, while obtaining a region releasing light from the light-emitting elements. Hence, the display device 2 according to this embodiment can simultaneously achieve high luminance and high light-transparency more efficiently.

Moreover, the display device 2 according to this embodiment releases light from the first light-emitting element 613, the second light-emitting element 6G, and the third light-emitting element 6R in the first direction D1, and light from the fourth light-emitting element 26B, the fifth light-emitting element 26G, and the sixth light-emitting element 26R in the second direction D2. Furthermore, the light-emitting elements according to this embodiment can be driven independently.

Hence, the display device 2 according to this embodiment can display different views from the transparent substrate 4 in the first direction D1 and the second direction D2. In other words, the display device 2 according to this embodiment can be a double-sided display device capable of displaying a different view on each of the screens.

Specifically, the view from the transparent substrate 4 in the first direction D1 is presented by the control to drive the first light-emitting element 6B, the second light-emitting element 6G, and the third light-emitting element 6R. Meanwhile, the view from the transparent substrate 4 in the second direction D2 is presented by the control to drive the fourth light-emitting element 26B, the fifth light-emitting element 26G, and the sixth light-emitting element 26R.

Here, the fourth light-emitting element 26B, the fifth light-emitting element 26G, and the sixth light-emitting element 26R release light in the second direction D2; that is, in a direction away from the transparent substrate 4. Hence, as illustrated in FIG. 19, the TFTs 16 are preferably formed in positions to coincide with the fourth light-emitting element 26B, the fifth light-emitting element 26G, and the sixth light-emitting element 26R in the first direction D1. Thanks to the above configuration, the display device 2 according to this embodiment has an advantageous effect; that is, the TFTs 16 are less likely to influence on the light released from the light-emitting elements in both the first direction D1 and the second direction D2.

Figure 20:
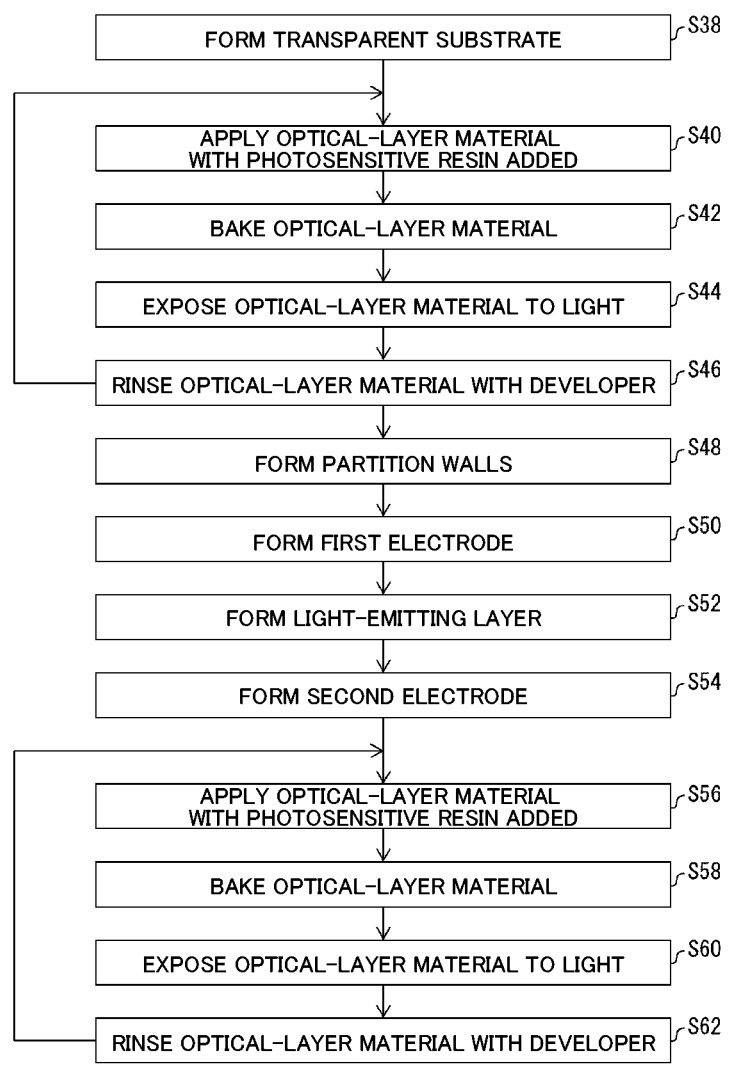
FIG. 20 is a flowchart showing a method for producing the display device according to the third embodiment of the disclosure.
Figure 21:
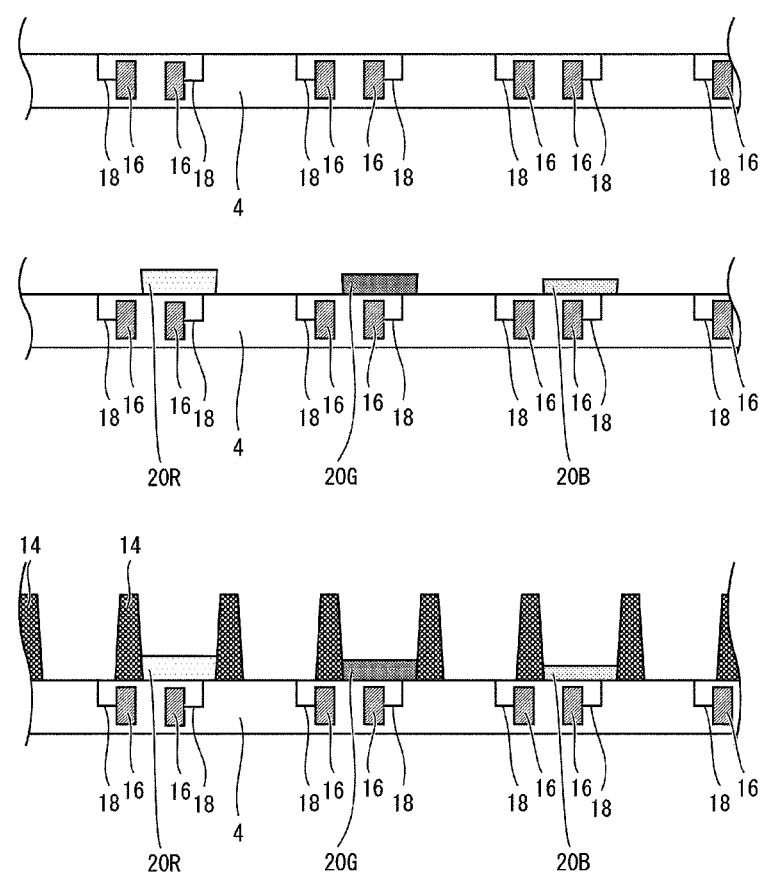
FIG. 21 shows cross-sectional views to illustrate steps of the method for producing the display device according to the third embodiment of the disclosure.
Figure 22:
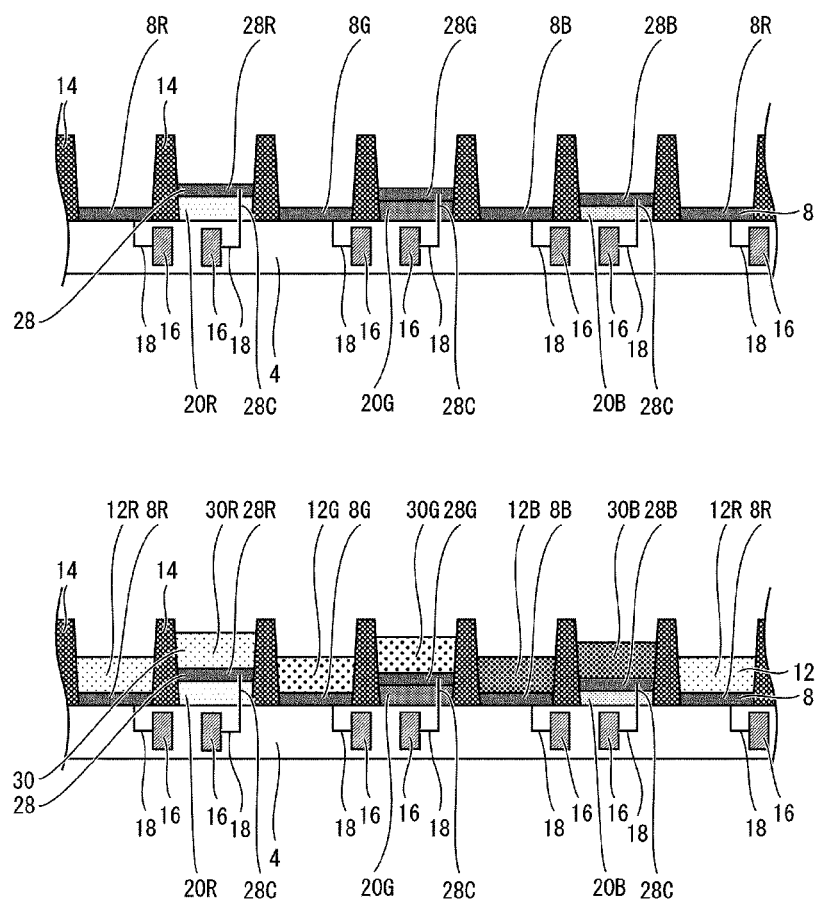
FIG. 22 shows cross-sectional views to illustrate other steps of the method for producing the display device according to the third embodiment of the disclosure.
Figure 23:
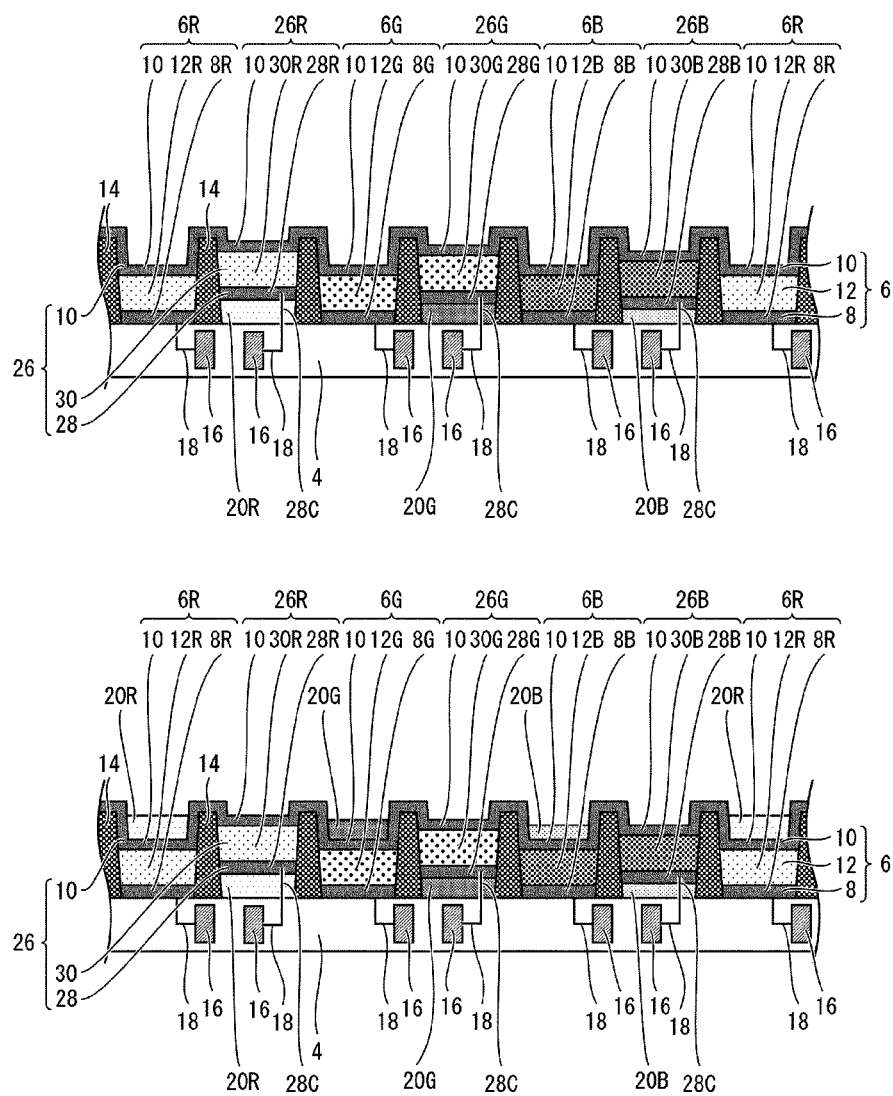
FIG. 23 shows cross-sectional views to illustrate other steps of the method for producing the display device according to the third embodiment of the disclosure.

Described next is a method for producing the display device 2 according to this embodiment, with reference to FIGS. 20 to 23. FIG. 20 is a flowchart showing a method for producing the display device 2 according to this embodiment. FIGS. 21 to 23 show cross-sectional views to illustrate steps of the method for producing the display device 2 according to this embodiment.

In the method for producing the display device 2 according to this embodiment, first, at Step S38, the transparent substrate 4 is formed. Step S38 may be carried out by the same technique as Step S2 of the first embodiment is.

At Step S40, an optical-layer material is applied to the transparent substrate 4. At Step S42, the optical-layer material is prebaked. At Step S44, the prebaked optical-layer material is exposed to light, using a photomask. At Step S46, the optical-layer material is rinsed with an appropriate developer. Steps S40 to S46 may be carried out by the same techniques as Steps S22 to S28 according to the previous embodiment are. Hence, the first optical layer 20B, the second optical layer 20G, and the third optical layer 20R are formed.

Here, at Steps S40 to S46, the first optical layer 20B, the second optical layer 20G, and the third optical layer 20R are formed in positions to coincide with the fourth light-emitting element 26B, the fifth light-emitting element 26G, and the sixth light-emitting element 26R in the first direction D1. In other words, of the first optical layers 20B, the second optical layers 20G, and the third optical layers 20R, the optical layers formed at Steps S40 to S46 are directly formed on the transparent substrate 4.

At Step S48, the partition walls 14 are formed on the transparent substrate 4. Step S48 may be carried out by the same technique as Step S4 above is.

At Step S50, the first electrodes 8 and 28 are formed. Step S50 may be carried out by the same technique as Step 86 above is.

Here, at Step S50, for example, a material of the first electrodes 8 and 28 may be deposited on all the top faces of the transparent substrate 4, the partition walls 14, the first optical layer 20B, the second optical layer 20G, and the third optical layer 20R, and the material may be patterned. Hence, at Step S50, the first electrodes 8 and 28 can be formed at the same step.

At Step S52, the light-emitting layers 12 and 30 are formed. Step S52 may be carried out by the same technique as Step S8 above is.

Here, at Step S52, for example, a material containing a mixture of a light emitter and a photosensitive material is applied to the top faces of the partition walls 14 and the first electrodes 8 and 28. The applied material is patterned. The application and patterning of the material may be repeated for each of the colors of the lights of the light-emitting layers. Hence, at Step S52, the light-emitting layers 12 and 30 can be formed at the same step.

At Step S54, the second electrode 10 is formed. Step S54 may be carried out by the same technique as Step S10 above is. Hence, the light-emitting-element layers 6 and 26 are formed. In other words, the first light-emitting element 6B, the second light-emitting element 6G, the third light-emitting element 6R, the fourth light-emitting element 26B, the fifth light-emitting element 26G, and the sixth light-emitting element 26R are formed.

At Step S56, an optical-layer material is applied to the transparent substrate 4. At Step S58, the optical-layer material is prebaked. At Step S60, the prebaked optical-layer material is exposed to light, using a photomask, At Step S62, the optical-layer material is rinsed with an appropriate developer. Steps S56 to S62 may be carried out by the same techniques as Steps S12 to S18 according to the first embodiment are. Hence, the first optical layer 20B, the second optical layer 20G, and the third optical layer 20R are formed, Here, at Steps 856 to S62 the first optical layer 20B, the second optical layer 20G, and the third optical layer 20R are formed in positions to coincide with the first light-emitting element 6B, the second light-emitting element 6G, and the third light-emitting element 6R in the second direction D2. In other words, of the first optical layers 20B, the second optical layers 20G, and the third optical layers 20R, the optical layers formed at Steps S56 to S62 are directly formed on the second electrode 10. Thus, the display device 2 illustrated in FIG. 19 is obtained. Note that, following the forming of the optical layers, the sealing layer may be formed to seal the light-emitting elements.

The present invention shall not be limited to the embodiments described above, and can be modified in various manners within the scope of claims. The technical aspects disclosed in different embodiments are to be appropriately combined together to implement another embodiment, Such an embodiment shall be included within the technical scope of the present invention. Moreover, the technical aspects disclosed in each embodiment may be combined to achieve a new technical feature.

The invention claimed is:

1. A display device, comprising:
    a first light-emitting element configured to emit a first light including a light having a first wavelength;
    a second light-emitting element configured to emit a second light including a light having a second wavelength different from the first wavelength;
    a fourth light-emitting element configured to emit a fourth light including another light having the first wavelength;

a fifth light-emitting element configured to emit a fifth light including another light having the second wavelength, wherein each of the first light emitted by the first light-emitting element and the second light emitted by the second light-emitting element is released in a first direction;

a first optical layer formed in a second direction, opposite the first direction, with respect to the first light-emitting element, and positioned to coincide with the first light-emitting element in the second direction, the first optical layer being transparent to the light having the second wavelength and reflective or absorptive of the light having the first wavelength;

a second optical layer formed in the second direction with respect to the second light-emitting element, and positioned to coincide with the second light-emitting element in the second direction, the second optical layer being transparent to the light having the first wavelength and reflective or absorptive of the light having the second wavelength; and a partition wall formed between the first light-emitting element and the second light-emitting element in a plan view, wherein the partition wall is further formed between the first optical layer and the second optical layer in the plan view, the first light-emitting element and the fourth light emitting-element are arranged adjacent to each other without any other light-emitting element positioned in between, and the second light-emitting element and the fifth light emitting-element are arranged adjacent to each other without any other light-emitting element positioned in between.

2. The display device according to claim 1, wherein the first wavelength is a peak wavelength of the first light, and the second wavelength is a peak wavelength of the second light.

3. The display device according to claim 1, wherein a thickness of the first optical layer and a thickness of the second optical layer are different from each other.

4. The display device according to claim 3, wherein an absolute refractive index of the first optical layer is higher than each of absolute refractive indexes of layers in contact with the first optical layer in the first direction and the second direction, and the thickness of the first optical layer is $(2m1+1)\lambda 1/4n1$, where the m1 is any given integer, the $\lambda 1$ is a peak wavelength of the first light, and the n1 is the absolute refractive index of the first optical layer.

5. The display device according to claim 3, wherein an absolute refractive index of the first optical layer is higher than an absolute refractive index of one of layers, and lower than an absolute refractive index of another one of the layers, in contact with the first optical layer in the first direction and the second direction, and the thickness of the first optical layer is $m1\cdot\lambda 1/2n1$, where the m1 is any given integer, the $\lambda 1$ is a peak wavelength of the first light, and the n1 is the absolute refractive index of the first optical layer.

6. The display device according to claim 3, wherein an absolute refractive index of the second optical layer is higher than each of absolute refractive indexes of layers in contact with the second optical layer in the first direction and the second direction, and the thickness of the second optical layer is $(2m2+1)\lambda 2/4n2$, where the m2 is any given integer, the $\lambda 2$ is a peak wavelength of the second light, and the n2 is the absolute refractive index of the second optical layer.

7. The display device according to claim 3, wherein an absolute refractive index of the second optical layer is higher than an absolute refractive index of one of layers, and lower than an absolute refractive index of another one of the layers, in contact with the first optical layer in the first direction and the second direction, and the thickness of the second optical layer is $m2\cdot\lambda 2/2n2$, where the m2 is any given integer, the 22 is a peak wavelength of the second light, and the n2 is the absolute refractive index of the second optical layer.

8. The display device according to claim 1, further comprising:

a third light-emitting element configured to emit a third light including a light having a third wavelength different from both the first wavelength and the second wavelength; and a sixth light-emitting element configured to emit a sixth light including another light having the third wavelength, wherein the third light emitted by the third light-emitting element is released in the first direction, the first optical layer and the second optical layer are further transparent to the light having the third wavelength, the display device further includes a third optical layer formed in the second direction with respect to the third light-emitting element, and positioned to coincide with the third light-emitting element in the second direction, the third optical layer being transparent to both the light having the first wavelength and the light having the second wavelength and reflective or absorptive of the light having the third wavelength, and the third light-emitting element and the sixth light emitting-element are arranged adjacent to each other without any other light-emitting element positioned in between.

9. The display device according to claim 8, wherein the third wavelength is a peak wavelength of the third light.

10. The display device according to claim 8, wherein a thickness of the first optical layer, a thickness of the second optical layer, and a thickness of the third optical layer are different from one another.

11. The display device according to claim 10, wherein an absolute refractive index of the third optical layer is higher than each of absolute refractive indexes of layers in contact with the third optical layer in the first direction and the second direction, and the thickness of the third optical layer is $(2m3+1)\lambda 3/4n3$, where the m3 is any given integer, the $\lambda 3$ is a peak wavelength of the third light, and the n3 is the absolute refractive index of the third optical layer.

12. The display device according to claim 10, wherein an absolute refractive index of the third optical layer is higher than an absolute refractive index of one of layers, and lower than an absolute refractive index of another one of the layers, in contact with the third optical layer in the first direction and the second direction, and the thickness of the third optical layer is $m3\cdot\lambda 3/2n3$, where the m3 is any given integer, the 23 is a peak wavelength of the third light, and the n3 is the absolute refractive index of the third optical layer.

13. The display device according to claim 8, wherein the first light is a blue light, the second light is a green light, and the third light is a red light.

14. The display device according to claim 8, wherein the sixth light is released in the second direction,
the third optical layer is formed in the first direction with respect to the sixth light-emitting element, and positioned to coincide with the sixth light-emitting element in the first direction.

15. The display device according to claim 1, wherein each of the fourth light and the fifth light is released in the second direction,
the first optical layer is formed in the first direction with respect to the fourth light-emitting element, and positioned to coincide with the fourth light-emitting element in the first direction, and
the second optical layer is formed in the first direction with respect to the fifth light-emitting element, and positioned to coincide with the fifth light-emitting element in the first direction.

16. The display device according to claim 1, wherein at least one of the first optical layer or the second optical layer comprises a thin-film coating.

17. The display device according to claim 1, wherein at least one of the first optical layer or the second optical layer comprises a thin-film coating including a pearl pigment.

18. The display device according to claim 1, wherein at least one of the first optical layer or the second optical layer comprises a thin-film coating including a coloring agent selectively absorbing a specific wavelength.

19. The display device according to claim 1, wherein at least one of the first light-emitting element or the second light-emitting element comprises quantum dots as a light emitter.

20. The display device according to claim 1, wherein the partition wall reflects or absorbs visible light.

* * * * *